United States Patent
Foegelle

(10) Patent No.: US 10,085,162 B2
(45) Date of Patent: Sep. 25, 2018

(54) SYSTEM AND METHOD FOR OVER-THE-AIR TESTING OF MILLI-METER WAVE AND OTHER BEAMFORMING TECHNOLOGIES

(71) Applicant: ETS-Lindgren Inc., Cedar Park, TX (US)

(72) Inventor: Michael Foegelle, Cedar Park, TX (US)

(73) Assignee: ETS-Lindgren, Inc., Cedar Park, TX (US)

( * ) Notice: Subject to any disclaimer, the term of this patent is extended or adjusted under 35 U.S.C. 154(b) by 0 days.

(21) Appl. No.: 15/452,115

(22) Filed: Mar. 7, 2017

(65) Prior Publication Data
US 2018/0027434 A1    Jan. 25, 2018

Related U.S. Application Data

(60) Provisional application No. 62/365,588, filed on Jul. 22, 2016.

(51) Int. Cl.
| | |
|---|---|
| *H04W 24/06* | (2009.01) |
| *H04B 7/06* | (2006.01) |
| *H04B 7/10* | (2017.01) |
| *H04B 7/0404* | (2017.01) |

(52) U.S. Cl.
CPC .......... *H04W 24/06* (2013.01); *H04B 7/0617* (2013.01); *H04B 7/10* (2013.01); *H04B 7/0404* (2013.01)

(58) Field of Classification Search
CPC .... H04W 24/06; H04W 24/08; H04B 7/0617; H04B 7/10; G01R 31/001
See application file for complete search history.

(56) References Cited

U.S. PATENT DOCUMENTS

| | | | | |
|---|---|---|---|---|
| 7,477,877 B2* | 1/2009 | Bednasz | ............... | G01R 29/10 |
| | | | | 343/702 |
| 8,971,821 B2 | 3/2015 | Schlub et al. | | |
| 9,094,056 B2* | 7/2015 | Ouyang | ............... | H04B 5/0043 |

(Continued)

FOREIGN PATENT DOCUMENTS

| | | |
|---|---|---|
| JP | 09311153 | 12/1997 |
| JP | 2009052990 | 3/2009 |

OTHER PUBLICATIONS

European Communication dated Dec. 7, 2017 for European Application No. 17179164.3 consisting of 14 pages.

*Primary Examiner* — Devan Sandiford
(74) *Attorney, Agent, or Firm* — Christopher & Weisberg, P.A.

(57) ABSTRACT

A method and system for measurement of a device under test (DUT) are provided. According to one aspect, a system includes a first positioner having a first antenna and a second positioner having a second antenna. The system also includes circuitry configured to cause the first antenna to radiate a test signal to the DUT and to implement one of a probing mode and an interference mode. The probing mode causes, for each of at least one position of the first antenna, the second antenna to receive a signal from the DUT at each of the second set of positions of the second antenna. The interfering mode causes, for each of at least one position of the first antenna, the second antenna to transmit an interfering signal to the DUT at each of the second set of positions of the second antenna.

20 Claims, 13 Drawing Sheets

(56) References Cited

U.S. PATENT DOCUMENTS

| | | | |
|---|---|---|---|
| 9,377,495 B2* | 6/2016 | Chien | G01R 29/105 |
| 9,613,465 B1* | 4/2017 | Tsai | G01B 11/303 |
| 9,614,627 B2* | 4/2017 | Yu | H04B 17/0085 |
| 9,618,554 B2* | 4/2017 | Kajbaf | G01R 29/0892 |
| 2002/0040466 A1* | 4/2002 | Khazei | G01R 31/001 |
| | | | 716/115 |
| 2006/0055592 A1* | 3/2006 | Leather | G01R 29/105 |
| | | | 342/174 |
| 2006/0194553 A1* | 8/2006 | Ozaki | G01R 29/10 |
| | | | 455/226.1 |
| 2008/0056340 A1* | 3/2008 | Foegelle | H04B 17/0082 |
| | | | 375/224 |
| 2008/0129615 A1* | 6/2008 | Breit | G01R 29/105 |
| | | | 343/703 |
| 2009/0295405 A1* | 12/2009 | Pommerenke | G01R 29/0878 |
| | | | 324/627 |
| 2010/0045543 A1* | 2/2010 | Kitada | G01R 29/105 |
| | | | 343/703 |
| 2010/0156896 A1* | 6/2010 | Ichimura | G01B 11/245 |
| | | | 345/419 |
| 2010/0171669 A1 | 7/2010 | Ito et al. | |
| 2010/0285753 A1* | 11/2010 | Foegelle | H04B 17/21 |
| | | | 455/67.12 |
| 2011/0095950 A1* | 4/2011 | Yu | H04W 24/06 |
| | | | 343/703 |
| 2012/0100813 A1 | 4/2012 | Mow et al. | |
| 2012/0225624 A1* | 9/2012 | Kyosti | H01Q 3/2605 |
| | | | 455/67.11 |
| 2013/0002273 A1* | 1/2013 | Min | G01R 31/001 |
| | | | 324/750.01 |
| 2013/0002275 A1* | 1/2013 | Min | G01R 35/005 |
| | | | 324/750.02 |
| 2013/0093447 A1* | 4/2013 | Nickel | H04W 24/06 |
| | | | 324/750.16 |
| 2014/0087668 A1 | 3/2014 | Mow et al. | |
| 2014/0141726 A1* | 5/2014 | Schlub | G01R 29/0857 |
| | | | 455/67.12 |
| 2014/0226167 A1* | 8/2014 | Smith | G03B 21/14 |
| | | | 356/614 |
| 2014/0256267 A1* | 9/2014 | Chien | G01R 29/105 |
| | | | 455/67.12 |
| 2014/0267624 A1* | 9/2014 | Hara | G01B 11/2504 |
| | | | 348/46 |
| 2014/0307568 A1* | 10/2014 | Zhang | H04B 7/0689 |
| | | | 370/252 |
| 2015/0093987 A1* | 4/2015 | Ouyang | H04B 5/0043 |
| | | | 455/41.1 |
| 2015/0116164 A1* | 4/2015 | Mannion | G01R 29/10 |
| | | | 343/703 |
| 2015/0146215 A1* | 5/2015 | Kobayashi | G01B 11/2504 |
| | | | 356/610 |
| 2015/0177301 A1* | 6/2015 | Kajbaf | G01R 29/0892 |
| | | | 324/612 |
| 2016/0072598 A1 | 3/2016 | Jonsson et al. | |
| 2016/0105811 A1* | 4/2016 | Khurana | H04W 24/06 |
| | | | 370/252 |
| 2016/0334450 A1* | 11/2016 | Patton | G01R 1/073 |
| 2016/0359573 A1* | 12/2016 | Pauly | H04B 17/12 |
| 2017/0068771 A1* | 3/2017 | Muchaidze | G06F 17/5081 |
| 2017/0223559 A1* | 8/2017 | Kong | H04B 7/0413 |
| 2017/0338550 A1* | 11/2017 | Alon | H01Q 1/245 |
| 2017/0339335 A1* | 11/2017 | Kuokkanen | H04N 5/23216 |
| 2017/0356946 A1* | 12/2017 | Gregory | G01R 31/001 |

* cited by examiner

SYSTEM AND METHOD FOR OVER-THE-AIR TESTING OF MILLI-METER WAVE AND OTHER BEAMFORMING TECHNOLOGIES

CROSS REFERENCE TO RELATED APPLICATIONS

This application claims priority of U.S. Provisional Application Ser. No. 62/365,588 filed on Jul. 22, 2016, which is incorporated herein in its entirety by reference.

TECHNICAL FIELD

This disclosure relates to a method and system for electromagnetic measurements.

BACKGROUND

Traditional antenna pattern measurement techniques utilize spherical scanning systems using mechanical or electronic positioning systems to move a transmitting and receiving antenna relative to each other in spherical coordinates. The positioning systems are generally disposed with two orthogonal axes of motion (e.g., theta and phi) to cover evenly spaced positions corresponding to the two angles of the spherical coordinate system. In any given implementation, each orthogonal positioner rotates either the antenna/device under test (AUT/DUT) in the center of the test volume, or the measurement antenna (MA) around the perimeter of the test range. The third spherical coordinate of radius (range length) is fixed for a given test implementation. The result is that the MA transcribes a sphere around the DUT in the DUT reference coordinates, with a radius defined as the range length, and always points toward the center of that sphere.

A third axis of polarization is also typically required along the radial direction between the center of the test volume and MA (i.e., along the axis of the MA). Polarization change is often performed electrically using a dual polarized antenna and switch, although a mechanical rotator can be used to rotate a single antenna element by ninety degrees about the axis of propagation from the center of the test volume. Likewise, one or both axes of spherical motion may be accomplished electrically by using measurement antennas in fixed locations and switching between them. In some implementations, two co-axial positioning approaches (i.e., a switched array and a mechanical positioner) are used to reach angles not accessible by a single solution (e.g., just the array).

These antenna pattern measurement techniques have been adapted for use in over-the-air (OTA) performance testing of wireless devices, whereby active radio frequency (RF) communication is carried out between the device under test (DUT) and a wireless communication tester connected to the MA. These tests are generally performed in a fully anechoic chamber to eliminate reflections and outside interference so that the pattern measurement test represents an average line-of-sight (LOS) performance of the DUT. Tests cover edge-of-link performance metrics of total radiated power (TRP) and total isotropic sensitivity (TIS) to determine the average transmitter and receiver performance in an over-the-air line-of-sight configuration. Note that the term RF as used herein means any frequency used for communication between radios, including microwave and millimeter wave frequencies.

Since most modern wireless devices utilize multiple antennas to address problems caused by multipath propagation in a real world environment, and even adapt to and benefit from such environments with concepts like multiple-input/multiple-output (MIMO) communication, new test systems have been developed for evaluating the performance of a DUT in an emulated multipath environment. An array of antennas distributed in two or three dimensions on the surface of a sphere about the DUT are fed simultaneously with the output of a spatial channel emulator to produce multi-cluster multipath scenarios, while the device is placed in different orientations representing typical usage cases within that environment. The result is no longer a radiation pattern of the DUT but rather an indication of the average performance of the DUT in the emulated environment. Tests have also moved from just evaluating edge-of-link platform sensitivity behavior to determining higher level multiple antenna performance in the presence of an unwanted interferer injected into the environment alongside the intended communication signals.

The existing over-the-air techniques were developed for existing wireless technologies; first for single input/single output (SISO) systems where all that was required was to use existing antenna pattern measurement (APM) techniques coupled with active communication testing, and later for MIMO and other multiple-antenna designs where multipath and spatial behaviors became an important part of overall radio performance. However, emerging wireless radio technologies are pushing the limits of even these systems and methods. Concepts like active beamforming and other adaptive antenna system approaches require that the test system be able to evaluate the combined performance of the radio, the antennas, and the software algorithms behind them. The technology is also moving towards a future where the behavior of the radio transceiver cannot be isolated from the antennas used and must therefore be tested completely in an over-the-air configuration.

The limitations in traditional SISO APM approaches are well known and require that the device under test be configured to generate a static antenna pattern in order to allow the measurement process to capture the radiated performance in each direction that represents a single snapshot in time of the device performance. Any adaptation that the device would otherwise perform as a function of the test process itself would invalidate the test results, giving an answer that had no meaning in terms of the real world performance of the device. This is because such adaptation violates fundamental assumptions of the antenna pattern measurement process, such as the fact that the two orthogonal polarization components measured at any given point represent components of the same field vector. If the device instead adapts to the change in polarization, the sum of those two components has no physical meaning, but rather is an artifact of the interaction between the test process and the DUT adaptation algorithm.

The boundary array RF environment emulation overcomes some of these problems by emulating a typical environment to which the DUT would be expected to adapt and evaluating the resulting performance. However, the boundary array also suffers practical limitations in both cost and complexity that impose limits on what is possible in current implementations. Primarily, the emulated environment is subject to Nyquist rules that increase the required number of antennas in the boundary array as the device size increases relative to a wavelength.

Proposed fifth generation (5G) mobile network technologies will rely heavily on beamforming techniques, both in the current bands where massive MIMO is intended to allow many simultaneous users in the same physical and spectrum space, and at the higher millimeter wave frequencies where current test technologies and propagation models don't necessarily apply.

For massive MIMO, large arrays with tens to hundreds of antennas will be needed to create simultaneous independent communication channels to different users. The physical size of these arrays will make typical boundary array test approaches difficult, and the beam forming adaptation that is the whole point of the technology cannot be tested properly in traditional APM based OTA test systems.

To overcome the path loss limitations that increase as a function of frequency, millimeter (mm) wave technologies are expected to rely heavily on beamforming techniques to find the best single path communication while also minimizing interference in order to increase the signal-to-noise-ratio (SNR) at the receiver. In addition to the narrow beam arrays that will exceed the Nyquist limits of any practical boundary array, the high frequencies of operation and broad bandwidths place limitations on the possible test equipment. At these frequencies, even a few feet of RF cable has too much loss to be viable.

To address these limitations, the industry needs equipment and measurement techniques that will allow the evaluation of active beamforming for both the desired signal path and any relative interferer at RF frequencies that include millimeter wave frequencies.

SUMMARY

Systems and method for testing a device situated in a test volume are provided. According to one aspect, a system is configured to test a device under test via one of a plurality of testing modes. The system includes a first positioner having a first antenna and a second positioner having a second antenna. The system also includes circuitry configured to cause the first antenna to radiate a test signal to the DUT and to implement one of a plurality of testing modes. The plurality of testing modes includes a probing mode which causes, for each of at least one position of the first antenna, the second antenna to receive a signal from the DUT at each of the second set of positions of the second antenna; and an interfering mode which causes, for each of at least one position of the first antenna, the second antenna to transmit an interfering signal to the DUT at each of the second set of positions of the second antenna.

According to this aspect, in some embodiments, the system further includes at least one of receive and transmit circuitry mounted on the second positioner and configured to at least one of receive a signal from the DUT in the probing mode and transmit an interfering signal to the DUT in the interfering mode. In some embodiments, the circuitry is further configured to process information received from the DUT during one of the probing mode and the interfering mode. In some embodiments, the system further includes a third positioner having a third antenna, and wherein the circuitry is further configured to implement a second interfering mode which causes, for each of at least one position of the first antenna, the third antenna to transmit a second interfering signal to the DUT at each of a third set of positions of the third antenna. In some embodiments, the plurality of testing modes further includes a second probing mode, which causes the first antenna to transmit a first communication signal to the DUT and causes the second antenna to transmit a second communication signal to the DUT in order to test beamforming capabilities of the DUT.

According to another aspect, equipment for testing a device under test, DUT, in one of a plurality of modes is provided. The equipment includes a first antenna; a first positioner configured to position the first antenna about the DUT; and a first communication endpoint in electrical communication with the first antenna and configured to transmit signals to the DUT and receive signals from the DUT. The equipment further includes a second antenna; second positioner configured to position the second antenna about the DUT; and a second communication endpoint in electrical communication with the second antenna and configured to operate in one of a plurality of testing modes, the testing modes including at least one of a probing mode and an interfering mode, the second communication endpoint configured to receive in the probing mode and to transmit in the interfering mode.

According to this aspect, in some embodiments, the second positioner is a robotic arm having a plurality of joints configured to provide multiple degrees of freedom to enable variation of position of an end of the robotic arm about the DUT; and the second antenna is mounted at an end of the second positioner. In some embodiments, the degrees of freedom include a distance between the end of the first positioner and the DUT. In some embodiments, at least one joint is configured to accommodate a cable to conduct a signal to the second antenna. In some embodiments, a link forming the robotic arm has a through-bore to allow routing of the cable. In some embodiments, the second communication endpoint is mounted on the second positioner. In some embodiments, a position of the first positioner is controlled by a computer. In some embodiments, the equipment further includes a third antenna; a third positioner configured to position the third antenna about the DUT; and a third communication endpoint configured to at least one of transmit to the DUT and receive from the DUT. In some embodiments, the plurality of testing modes includes a third mode wherein the first communication endpoint is configured to transmit first communication signals to the DUT, and the second communication endpoint is configured to transmit second communication signals to the DUT to test a performance of the DUT. In these embodiments, the tested DUT performance may be one of beamforming ability, adjacent channel interference, and desensitization of the DUT.

According to another aspect, a computer program product stored in a non-transitory medium, the computer program product having instructions that when executed by a processor, configure the processor to generate commands that cause a first positioner to move a first antenna to a determined first set of at least one position about a device under test, DUT; and generate commands that cause a second positioner to move a second antenna to a determined second set of positions.

According to this aspect, in some embodiments, the instructions further include instructions, that when executed by the processor, configure the processor to generate a command to cause a receiver to receive a signal from the DUT, via the first antenna, for each position of the first set of at least one position. In some embodiments, the instructions further include instructions, that when executed by the processor, configure the processor to generate a command to cause a transmitter to transmit a signal to the DUT, via the first antenna, for each position of the first set of at least one position. The instructions further include instructions that when executed by the processor, configure the processor to select between modes in response to user input received by the processor: a first mode including receiving a signal via the second antenna from the DUT; and a second mode including transmitting an interference signal via the second antenna to the DUT. In some embodiments, the instructions further include instructions that when executed by the processor, configure the processor to: generate commands to cause the first positioner to position the first antenna at a first position; generate a command to cause a transmitter to transmit via the first antenna a communication signal to the device under test, DUT; and generate commands to cause a second positioner to position a second antenna at a plurality of positions about the DUT to probe a radiation pattern of the DUT at each of the plurality of positions of the second antenna. In some embodiments, the instructions further include instructions that when executed by the processor, configure the processor to: generate commands to cause the first positioner to position the first antenna at a first position; generate a command to cause a transmitter to transmit via the first antenna a communication signal to a device under test, DUT; and generate commands to cause a second positioner to position a second antenna at a plurality of positions about the DUT to radiate an interference signal to the DUT at each of the plurality of positions of the second antenna.

According to another aspect, a method for testing a device under test, DUT, in one of a plurality of modes is provided. The method includes generating commands that cause a first positioner to move a first antenna to a determined first set of at least one position about a device under test, DUT. The method also includes generating commands that cause a second positioner to move a second antenna to a determined second set of at least one position.

According to this aspect, in some embodiments, the method further includes generating a command to cause a receiver to receive a signal from the DUT, via the first antenna, for each position of the first set of at least one position. In some embodiments, the method further includes generating a command to cause a transmitter to transmit a signal to the DUT, via the first antenna, for each position of the first set of at least one position. In some embodiments, the method further includes selecting between modes in response to user input: a first mode comprising receiving a signal via the second antenna from the DUT; and a second mode comprising transmitting an interference signal via the second antenna to the DUT. In some embodiments, the method further includes: generating commands to cause the first positioner to position the first antenna at a first position; generating a command to cause a transmitter to transmit via the first antenna a communication signal to the device under test, DUT; and generating commands to cause a second positioner to position a second antenna at a plurality of positions about the DUT to probe a radiation pattern of the DUT at each of the plurality of positions of the second antenna. In some embodiments, the method includes generating commands to cause the first positioner to position the first antenna at a first position; causing a transmitter to transmit via the first antenna a communication signal to a device under test, DUT; and causing a second positioner to position a second antenna at a plurality of positions about the DUT to radiate an interference signal to the DUT at each of the plurality of positions of the second antenna.

BRIEF DESCRIPTION OF THE DRAWINGS

A more complete understanding of embodiments described herein, and the attendant advantages and features thereof, will be more readily understood by reference to the following detailed description when considered in conjunction with the accompanying drawings wherein.

DETAILED DESCRIPTION

Figure 1:
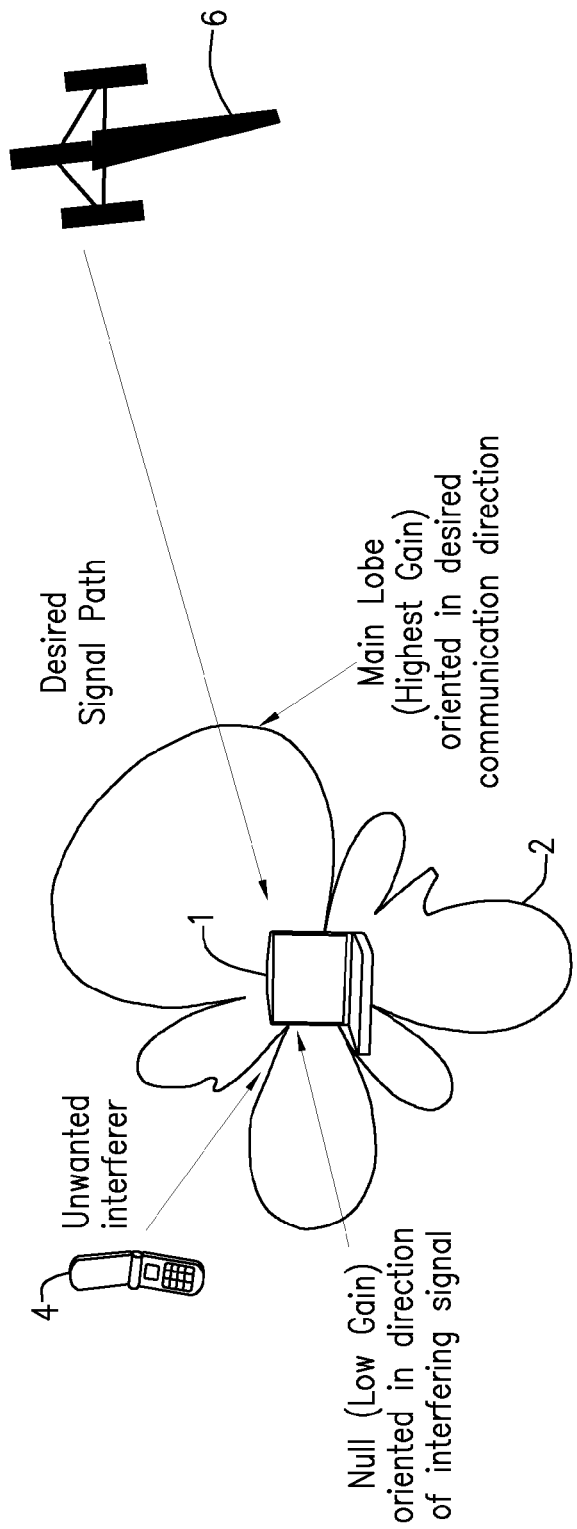
FIG. 1 is an illustration of signal to interference ratio impact of a beamforming antenna.

Before describing in detail exemplary embodiments, it is noted that the embodiments reside primarily in combinations of apparatus components and processing steps related to electromagnetic measurements. Accordingly, the system and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Some embodiments include one or more positioners with multiple degrees of freedom (e.g., a robotic arm) to allow positioning of one or more antennas in the space around a device under test (DUT). For example, a communication antenna may be attached to an end of an arm of a positioner to communicate with the DUT at various positions. Means for controlling polarization either mechanically or electrically may be included. At millimeter wave (mmWave) frequencies, the antenna may be attached to electrical up/down converters as needed to allow for lower frequency (e.g., baseband modulation) communication back to external test equipment. Optionally, a communication endpoint may be attached directly to the end of the positioner to generate the desired communication and test signals. For peer-to-peer device testing, the communication endpoint may be an endpoint that is equivalent to the device under test (DUT) with the communication endpoint having its own integrated antenna, or the communication endpoint could be a radio that utilizes a separate probe antenna attached to the positioner, similar to a cabled configuration.

The DUT may be mounted on a platform in the center of the test volume, the platform usually being made of low loss, low permittivity dielectric material to minimize RF reflections from the platform. In some implementations, this platform will rotate or otherwise articulate to allow orienting the DUT in different positions relative to the positioner that positions the RF antenna.

While some embodiments may be used to generate traditional antenna patterns and active communication based radiation patterns (transmit power and receiver sensitivity) by scanning a single antenna element around the DUT, in some embodiments, more than one positioner and antenna may be used to evaluate device performance. In one scenario, the communication endpoint communicates with the DUT via a first antenna at an end of the positioner, allowing the DUT to beam form a pattern to maintain a link to the first antenna. A second probe antenna may then be used to passively monitor the beam pattern produced by the DUT to determine how well the DUT is beamforming and what the beam pattern looks like. By monitoring the power at the communication endpoint, any variation in the beam pattern during the probing process can be detected. This process can then be repeated for different orientations of the communication antenna relative to the DUT in order to create and monitor a different beam pattern.

In a sensitivity test, the passive probing antenna is replaced by an active interferer, either as a simple signal or noise generator attached to the interferer antenna, or as another endpoint device to serve as an interfering device. In other words, a first positioner has an active antenna to transmit a desired signal to the DUT, while a second positioner has an active antenna to transmit an interfering signal to the DUT. The receiver performance and beamforming ability of the DUT to maximize its signal-to-interference ratio (SIR) can be evaluated for any desired relationship between the signal and interferer. By rotating the DUT relative to the first and second positioners, all desired degrees of freedom can be evaluated. At each relative orientation, the signal can be lowered or the interference can be increased to monitor the reaction of the DUT to the signal plus interference. A typical digital error rate or throughput test may be used as the metric to evaluate performance, or the DUT can be queried for chip level information from the DUT receiver such as estimated received signal strength (RSS) or carrier-to-noise ratio (C/N).

A third antenna and positioner combination may be added to monitor the impact of the SIR manipulation on the radiation pattern of the DUT. Additional antennas and positioners may be employed. For example, in some embodiments, more than one interfering antenna may be provided at the end of an independent positioner.

In some embodiments, two sources can communicate with the DUT simultaneously to simulate multi-user scenarios where an array of antennas on the DUT is configured to beam form different signals at the same frequency to multiple locations simultaneously. Then, an interfering communication signal may actually serve multiple uses simultaneously, evaluating the beamforming in the direction of the interferer while emulating multiple communication streams simultaneously. For example, the DUT may carry on two or more simultaneous communication sessions, the first communication session being considered as interfering with a second communication session and vice versa. The system would then be able to simultaneously evaluate the ability of the DUT to carry on those multiple communication sessions without a reduction in performance of any one or more of them.

FIG. 1 shows a wireless device 1, such as a wireless laptop computer, and an antenna pattern 2 of the wireless device. The wireless device 1 may adapt its antenna pattern 2 to place a null in the direction of an unwanted interferer 4 and place high gain in the direction of a desired base station 6. Such behavior is measurable by methods set forth herein. In some embodiments, the antenna pattern 2 of the wireless device 1 adapts to exhibit high gain in the presence of the communication signal from the base station 6 and may further adapt to suppress the unwanted signal from the interferer 4.

Figure 2:
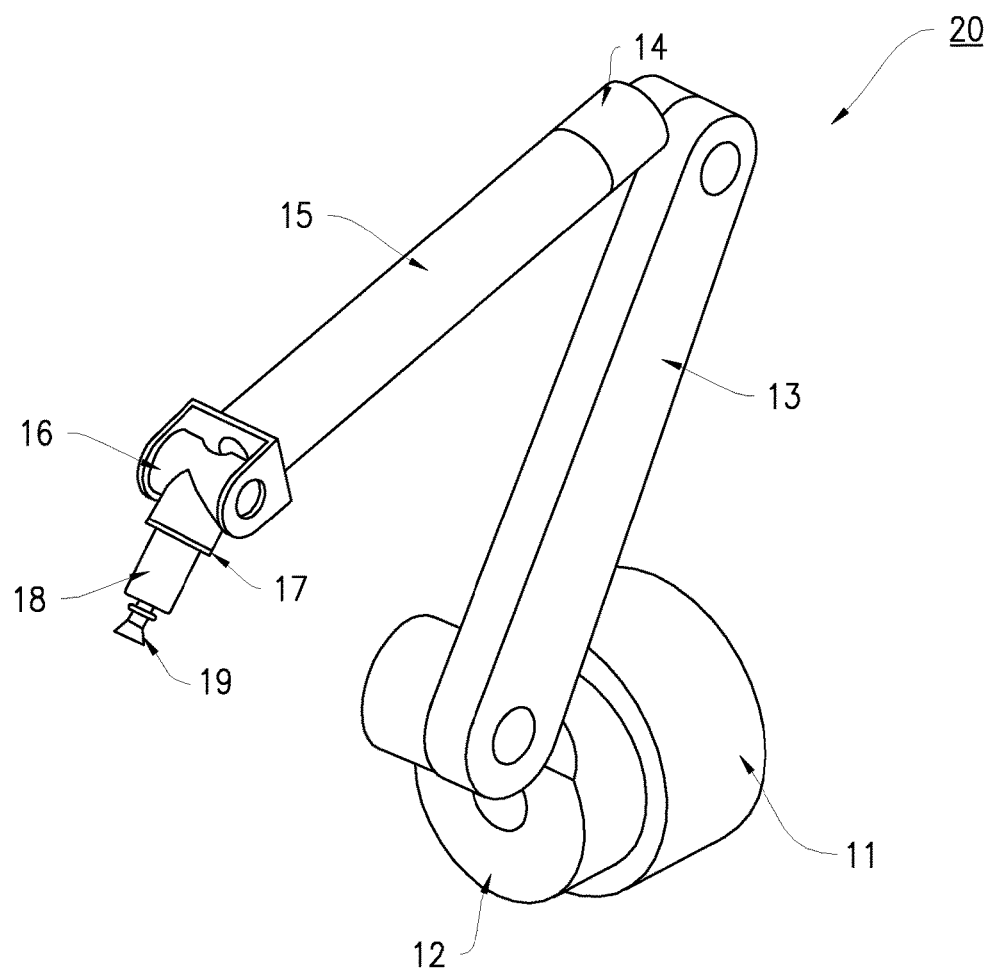
FIG. 2 is an illustration of a multi-axis robot arm with through axis bore holes to allow for rotary joint and cable routing.
Figure 3:
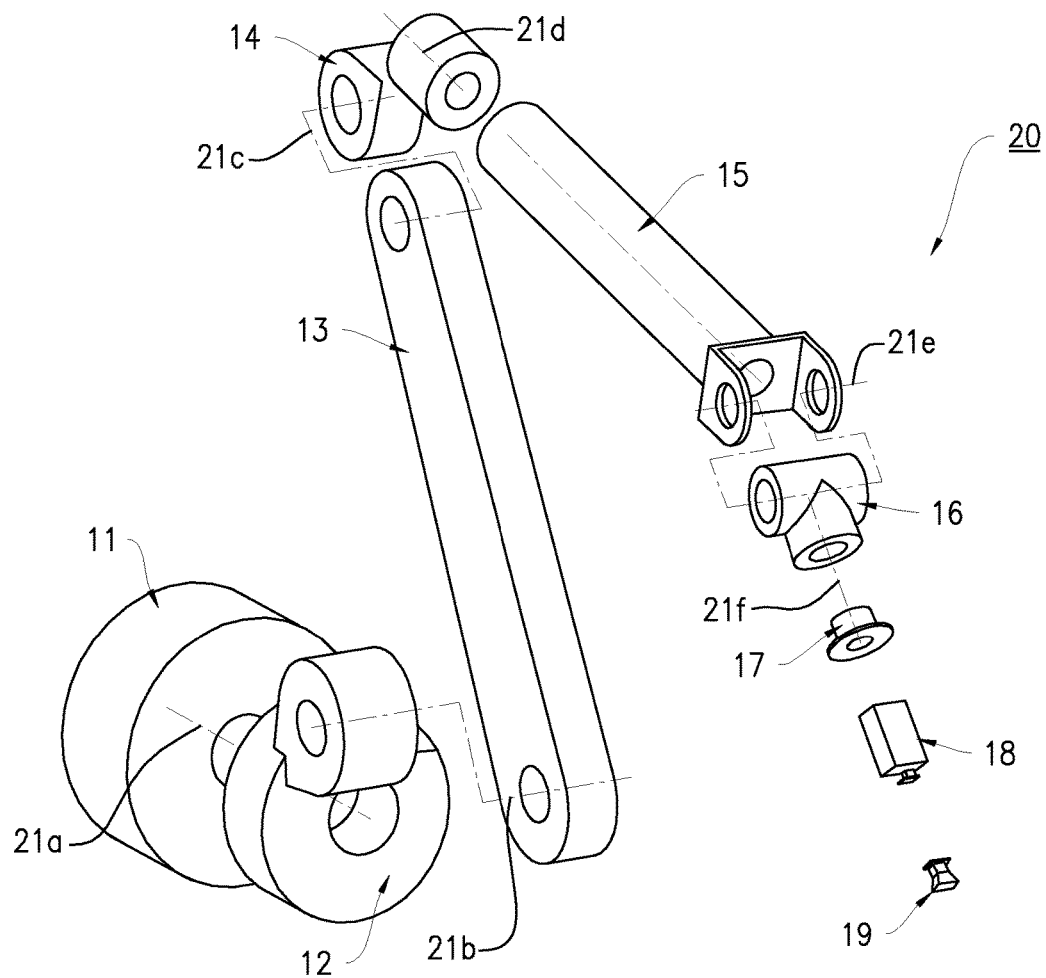
FIG. 3 is an exploded view of the robot arm of FIG. 2.

In one embodiment, a positioner 20 is a multi-axis robotic arm outfitted with a directional antenna 19, as shown in FIG. 2 and FIG. 3. The positioner 20 may be configured to cover all or a portion of an imaginary sphere around a DUT placed in the center of the sphere on an appropriate support. To achieve this, the positioner 20 may include a fixed base 11, a shoulder 12, and upper arm 13, an elbow 14, a forearm 15, a wrist 16, a hand 17, an up/downconverter or RF front end 18, and the antenna 19. The various parts pivot about axes 21a-21f. The positioner 20 is positionable in multiple degrees of freedom about a DUT 1.

Each joint between the elements of the positioner 20 may be equipped with an RF rotary joint to minimize the impact of flexing or twisting of cable. The joints may be designed with through bore axes to allow for routing of cables and on-axis rotary joint without interference for complete range of motion, or external brackets may be used on joints that do not have or need full 360 degree rotation. An exploded view of the positioner 20 is shown in FIG. 3. In addition to the multiple joints, bore holes may be provided to route a cable from a communication endpoint to the antenna 19 or to the RF front end 18. Thus, a cable may be routed through rotary joints at each axis 21a-f, and optionally through internal channels in parts 11-17 and connected to an up/downconverter or RF front end 18 and from there to the antenna 19. In an alternative embodiment, the RF front end is not positioned at the end of the positioner, but may be positioned anywhere along the length of the positioner 20 or separate from the positioner 20. In another alternative, the cable connecting the communication endpoint to the RF front end 18 or the antenna 19 may be routed by channels along the robot arms 13 and 15 or otherwise secured to the robot arm 13 and 15.

Figure 4:
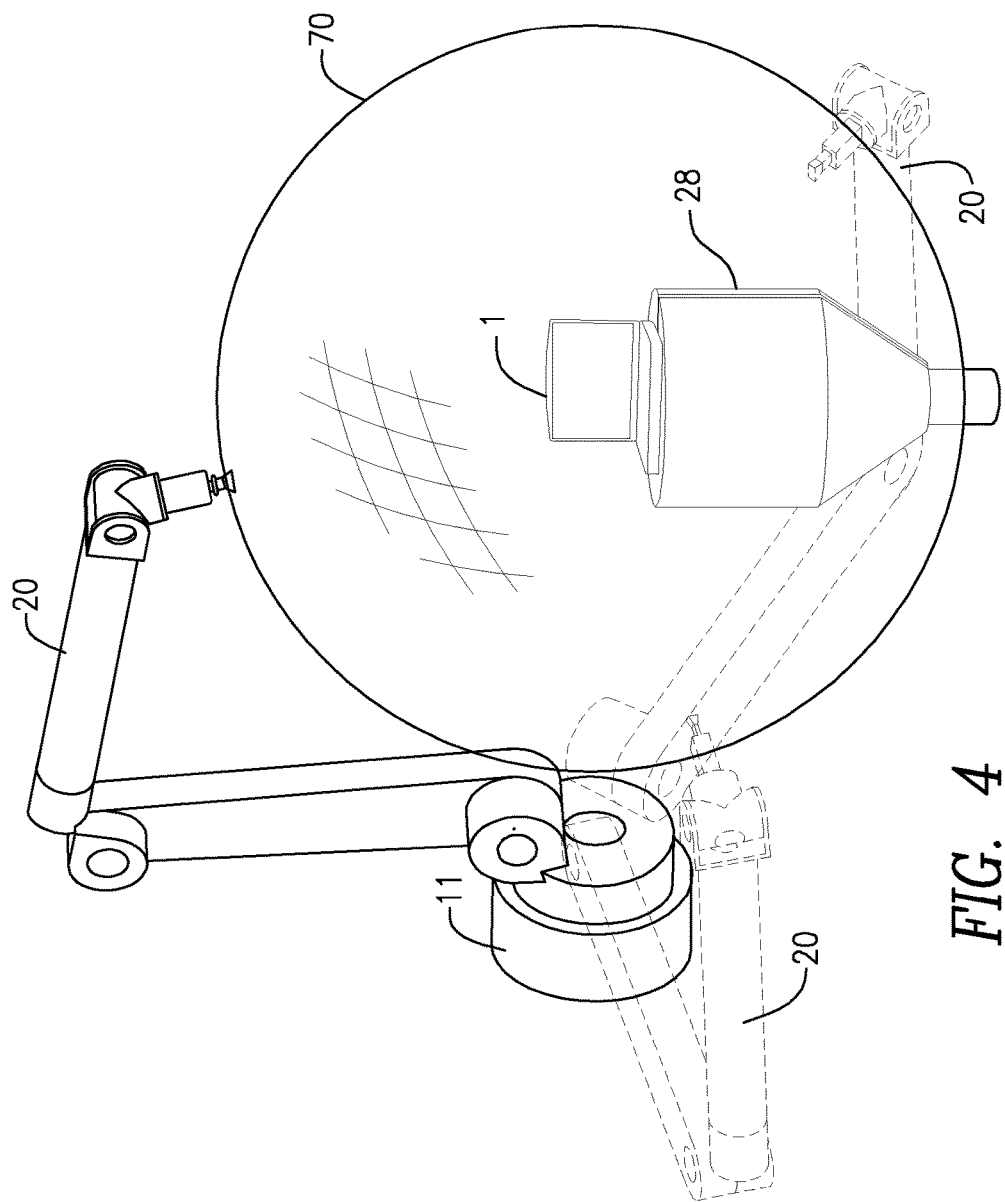
FIG. 4 is an illustration of a robot arm configured for spherical scanning around a DUT on a rotatable platform.

As shown in FIG. 4, the positioner 20 is positionable about the wireless device 1. The positioning may be manual by flexing or rotating the arms of the positioner 20 about the joints. Alternatively, the positioner arm segments may be positioned via motors, hydraulics, air pistons or other actuators, such as for example electroactive polymers.

Figure 5:
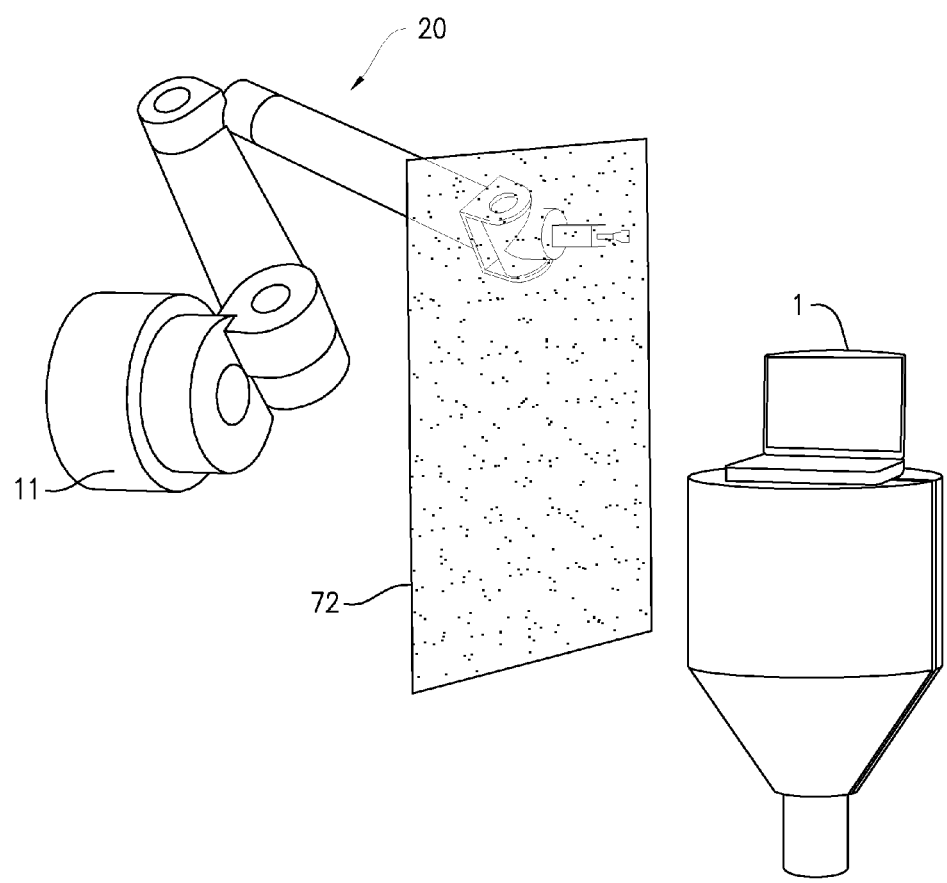
FIG. 5 is an illustration of planar scanning.
Figure 6:
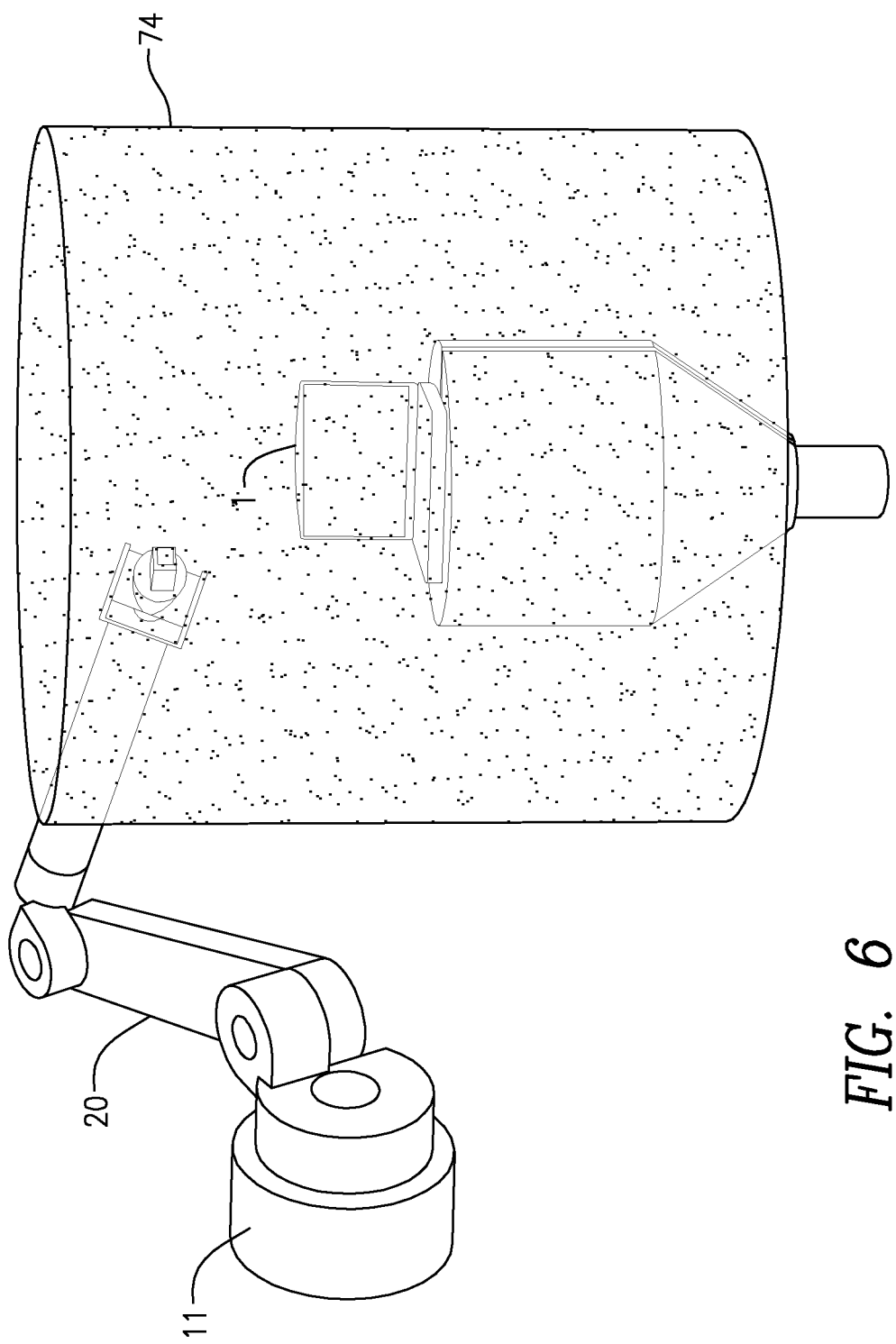
FIG. 6 is an illustration of cylindrical scanning.
Figure 7:
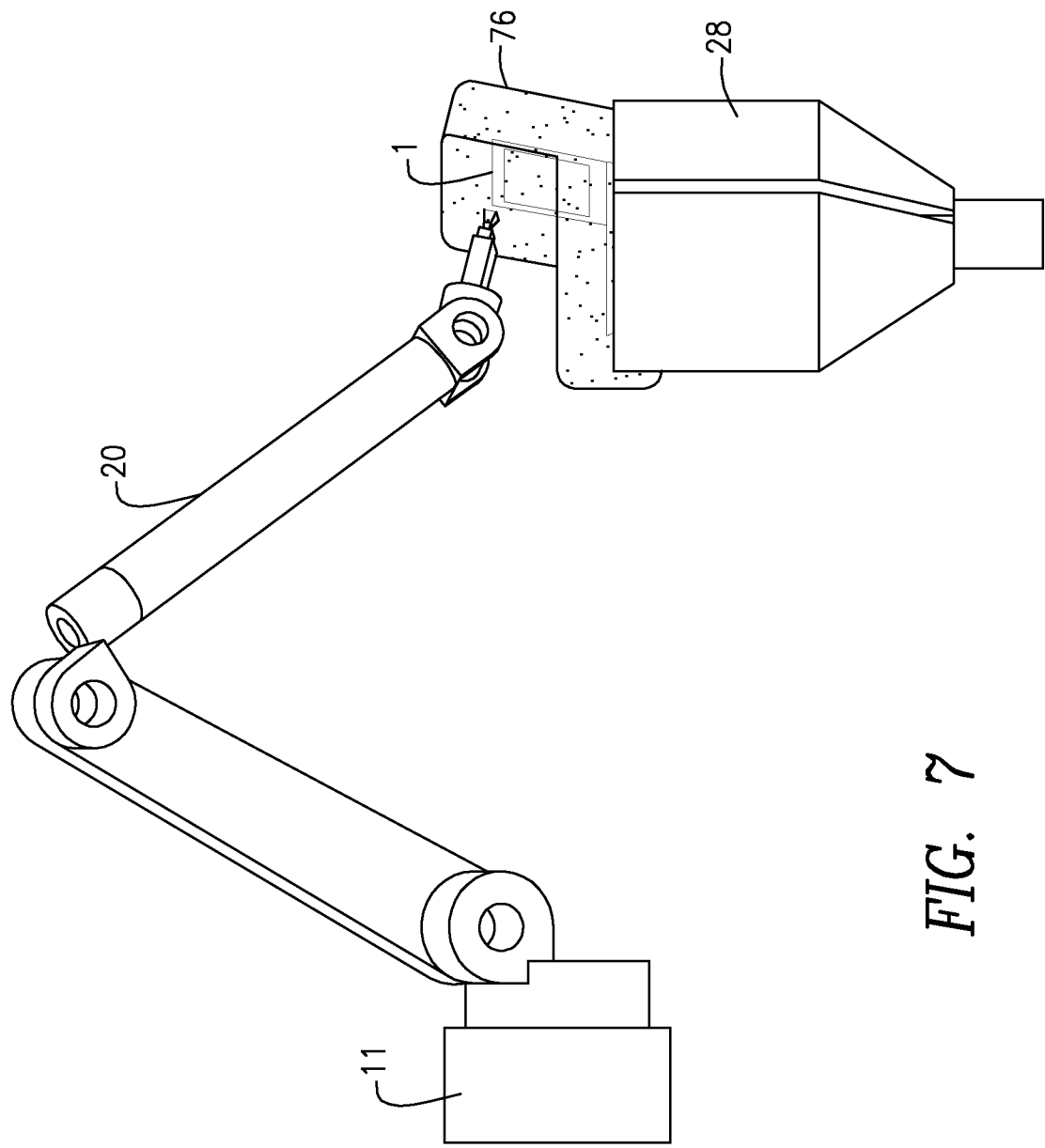
FIG. 7 is an illustration of conformal scanning.

Small devices 1 to be tested may be placed on a pedestal 28 to be centered in the spherical volume 70, while larger devices to be tested (e.g., vehicles, televisions, vending machines) may be mounted at floor level and tested with hemispherical or cylindrical scanning coverage as applicable for their given size and usage. The positioner 20 may be configured for planar scanning as shown in FIG. 5 scanning at a plane 72. The positioner 20 may be configured for cylindrical scanning as shown in FIG. 6 scanning at a cylinder 74. The positioner 20 may be configured for any other desired scanning approach to cover the desired portion of the radiation pattern for the DUT 1, as shown, for example, in FIG. 7, scanning at a conformal surface 76. In addition, the DUT 1 may be mounted on a positioning system 28 to provide rotation in one or more axes to provide additional relative positioning between the DUT 1 and measurement antenna (MA), especially in scenarios where it is not practical or possible for the robotic arm to reach around and behind the DUT 1 for a full spherical scan. The pedestal shown may be driven by a motor, turntable, or other azimuth rotator at the base, or larger devices may be mounted directly to the rotator. Alternately, multiple-axis positioning systems may be used to orient the DUT 1 in any desired position relative to the scanning arm.

RF absorber may be placed on appropriate portions of the positioner and other positioning and support equipment to minimize the reflections in the test volume. The entire system, including the positioner, the DUT 1, and DUT platform 28 may be placed in a shielded anechoic chamber to eliminate unwanted reflections and outside interference. In some embodiments, the communication endpoint may also be located within the chamber.

Appropriate test equipment (vector network analyzers (VNAs), signal generators, signal analyzers, broadband power sensors, communication testers, and/or peer radio end points) may be attached to an antenna at a distal end of a positioner to enable antenna pattern measurements and active communication testing scenarios. For example, the antenna 19 at the end of a positioner 20 may be connected to a receiver that receives the signal from the antenna 19, either directly or through appropriate down conversion and cabling (not shown). The signal from the antenna 19 may be responsive to a radiated antenna pattern of the DUT 1. By moving the positioner 20, and consequently the antenna 19, around the DUT 1, the antenna pattern of the DUT 1 can be determined.

A peer radio end point or communication tester, referred to herein as a communication endpoint, may be attached to the end of the positioner 20 using its own built-in antenna or an external test antenna 19, to communicate with the DUT 1 from each position of the positioner 20. In some embodiments, an RF front end may be mounted at an end of the positioner 20 with up/down conversion being performed at the end of the positioner 20 or at a position anywhere on the positioner 200 or separately from the positioner 20.

By positioning the antenna 19 at various points about the DUT 1 and transmitting energy to the DUT 1, the receiver sensitivity may be determined based on the response of the DUT 1 to the transmitted energy at each position of the positioner 20. By positioning the antenna 19 at various points about the DUT 1 and measuring radiation from the DUT 1 at each position, the transmit power pattern of the DUT 1 can be determined. Thus, both transmit power and receiver sensitivity may be evaluated by the active communication method, and desired metrics such as TRP/TIS, maximum gain, directivity, efficiency, side lobe levels, front to back ratio, etc. may be extracted from the resulting patterns.

Figure 8:
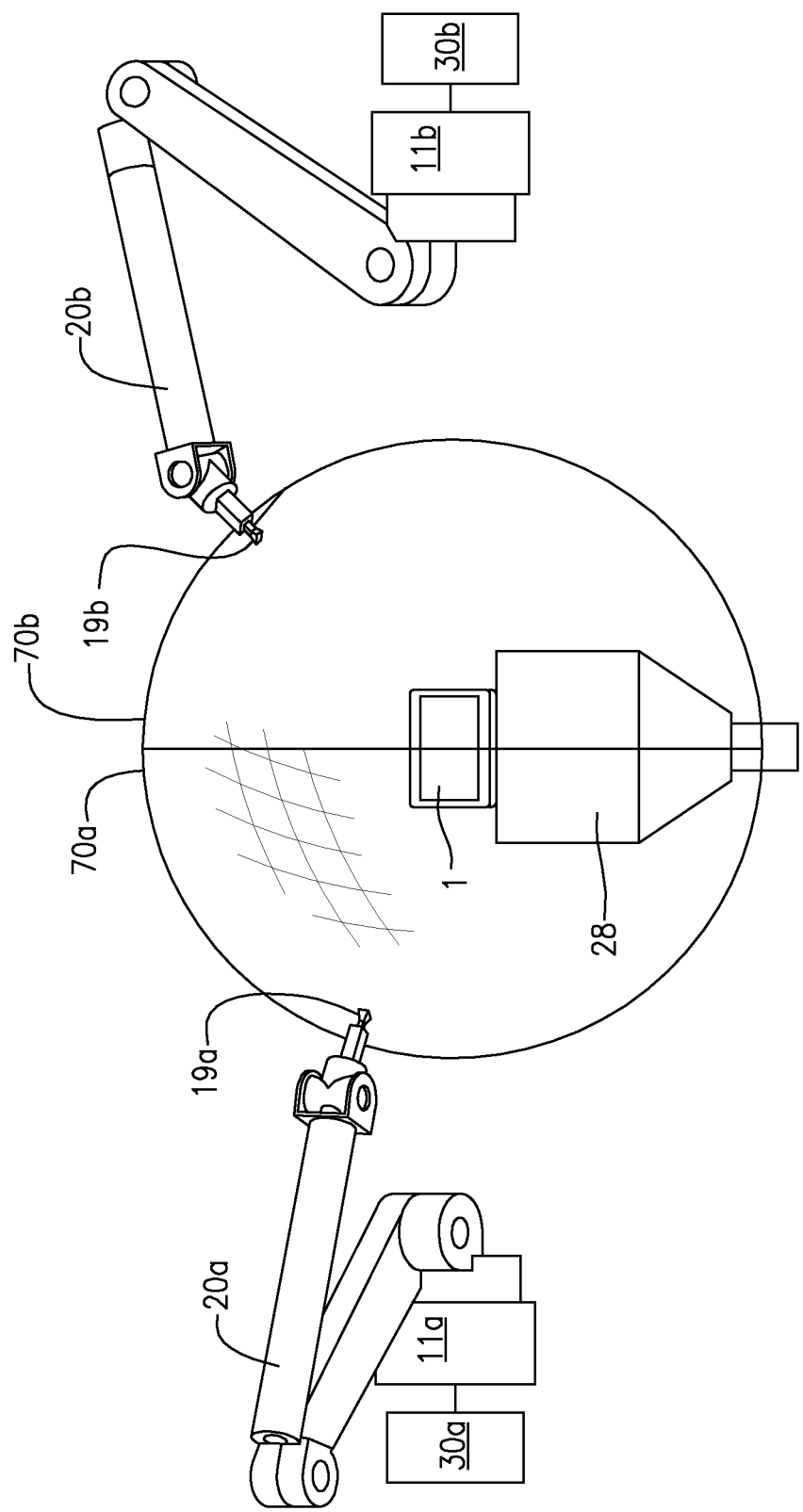
FIG. 8 is an illustration of two robot arms for scanning.

In another embodiment, referring to FIG. 8, a second positioner 20b, which may be a second robotic arm, is used in addition to the first positioner 20a configured for communication testing of a DUT 1. The plurality of positioners 20a and 20b are referred to collectively herein as positioners 20. In some embodiments, the first positioner 20a scans about the hemisphere 70a and the second positioner 20b scans about the hemisphere 70b. Other scanning surfaces may be implemented.

The second positioner 20b may be configured for power measurement of the signals produced by the DUT 1. The first positioner 20a and communication test system may be used to establish a link to the DUT 1 and cause it to adapt its antenna configuration (e.g. beamforming) to the desired orientation and polarization by moving the positioner 20a and antenna 19a to a chosen position and orientation relative to the DUT 1.

Once the communication link is established, the second positioner 20b may be used to probe, via an antenna 19b, the radiation pattern of the DUT 1 while it communicates with the first antenna 19a in the chosen position. The plurality of antennas 19a and 19b are referred to collectively herein as antennas 19. Note that a first communication endpoint 30a may be mounted somewhere on or in the vicinity of the first positioner 20a and a second communication endpoint 30b may be mounted somewhere on or in the vicinity of the second positioner 20b. Note that each positioner 20a and/or 20b may, in some embodiments, be positioned manually. Similarly, each transmitter and/or receiver may be manually configured to transmit continuously.

For example, a communication endpoint 30 may be mounted on an arm segment 13 or 15 of the positioner 20 or may be mounted at the end of the positioner 20 behind the antenna 19. Alternatively, in some embodiments, a communication endpoint 30a may be positioned at or near the base 11a of the positioner 20a and a communication endpoint 30b may be positioned at or near the base 11b of the positioner 20b. The communication endpoints 30a and 30b are referred to collectively herein as communication endpoints 30. In alternative embodiments, these communication endpoints 30 may be distributed between remote test equipment located near the positioners or outside any enclosing chamber and routed to antennas 19 through appropriate cabling and conversion. Note that the conversion may be between digital baseband and analog RF or between RF and an intermediate frequency.

Each communication endpoint 30 may have a receiver, a transmitter or both a receiver and transmitter. In some embodiments, an up-converter and/or a down-converter and power amplifier may be located on the positioner 20, with baseband and intermediate frequency receiver/transmitter components being located remote from the positioner 20. Using antennas 19a and 19b, capture of the radiation pattern of the beam-formed DUT 1 antenna without direct control of the beam forming process is enabled. In this case, the DUT 1 communicates with communication endpoint 30a via the first antenna 19a as it would in normal operation and the second antenna 19b and communication endpoint 30b are used to determine the pattern produced by the DUT 1 in this configuration. In some embodiments, the endpoint 30b may be a simple power meter when monitoring only the transmit pattern of the DUT 1 is contemplated.

In one mode of operation, the first antenna 19a monitors the link quality and detects any changes in the DUT 1 behavior that would indicate an alteration of its chosen radiation pattern, allowing the operator of the system to alter the test process or record suspect data points. The DUT 1 may also be configured to operate in a controlled manner to ensure that the beam-formed pattern does not change. The resulting pattern can be evaluated for quantities such as peak gain, total radiated power, sidelobe level, null depth, front-to-back ratio, etc.

In some modes of operation, the communication antenna 19a can be moved to as many different positions as desired and the pattern evaluation repeated via measurements of the probing antenna 19b. Alternately, the probing second antenna 19b can be fixed and the pattern that changes dynamically as the DUT 1 beam-forms to follow a moving communication antenna 19a can be measured. Likewise, both antennas 19 could scan continuously at various rates to cover any desired relative relationship in whatever time-frame is desired.

In some embodiments, the second positioner 20b is equipped with an antenna 19b that is connected to an interfering source. The interfering source could be an additive white Gaussian noise (AWGN) generator, or it could be another radio or programmable generator configured to generate interference on an adjacent or simultaneous channel. In this case, the receiver sensitivity of the DUT 1 may be evaluated in order to determine the ability of the beamforming antenna to maximize the signal to interference ratio (SIR) at the DUT 1. This may be done either by lowering the power of the transmitted communication signal from the first antenna 19a or by increasing the level of the interference from the second antenna 19b.

A digital error rate (e.g., bit, block, frame, or packet error rate) on the communication signal may be used to evaluate the performance, or the DUT 1 chipset may report a carrier to interference ratio or similar metric to indicate the resulting performance. Point-wise performance may be evaluated for each specific combination of relative DUT 1 position, source position, and interferer position, or an average performance metric may be obtained by evaluating the source and interferer relative to the DUT 1 position. By designing the armatures to cover a full hemispherical surface around opposite sides of the DUT 1, and placing the DUT 1 on a rotating platform, all possible relationships between the source, interferer, and DUT 1 can be achieved easily.

Another embodiment adds a third probing positioner and third antenna to the SIR evaluation system to probe the resulting radiation pattern created for each SIR combination. Likewise, yet another embodiment may add a second interferer on another positioner to increase the degrees of freedom for the interference. It is also possible to add more communication antennas 19 to evaluate instances of multipath. A person of ordinary skill in the art should recognize that additional robotic arm and antennas 19 with interferers, probes, or communication antennas may be added up to the practical limitations of the operating space around the DUT 1, given the disclosure of embodiments herein.

A traditional spherical antenna pattern measurement system typically consists of fixed single axis positioners that manipulate the DUT 1 and/or the measurement antenna in two orthogonal axes (theta and phi) to measure points on the surface of a sphere about the DUT 1. The radius of the antenna relative to the DUT 1 is fixed by the length of the arm or other supporting structure holding the antenna a fixed distance away from the DUT 1. Alternately, planar scanners may use X-Y positioners to move the antenna relative to the DUT 1 to record data in a plane. The X-Y positioners may be manually positioned or driven by motors, as may be implemented by persons of ordinary skill in the art of, for example, robotics. Combining a single linear Z-axis positioner with the DUT 1 on a turntable gives cylindrical scanning.

By replacing these positioning systems with a robotic arm, the same traditional spherical, cylindrical, and planar scans can be produced by one combination of equipment. In addition, completely conformal scans of the DUT 1 may be used to measure at a fixed or variable distance around an oddly shaped DUT 1. This approach becomes especially useful in testing at millimeter wave (mmWave) frequencies, where short range lengths and high gain antennas may be needed to overcome the large free space path loss at these frequencies.

While the single positioner system can be used for traditional antenna pattern measurements of passive antenna systems, most mmWave devices are envisioned to have integrated antennas 19 that cannot be tested independently from their radios. Likewise, the radios cannot be tested independently of the antenna array. Thus, the approach of adding broadband power sensors or down converters and signal analyzers to the system allows the measurement of transmit radiation patterns in a static controlled mode, while adding communication test equipment or communication endpoints allows for full active communication testing. In other words, in some embodiments, at least an RF front end of a first transmitter and/or first receiver may be positioned on a positioner 20a in proximity to the antenna 19a and a second transmitter and/or second receiver may be positioned on a positioner 20b in proximity to the antenna 19b. Further, additional positioners, antennas 19 and communication endpoints may be provided.

Likewise, the flexibility of the robot arm allows for radiation pattern measurements in all the traditional modes, but also allows for positioning the probe antenna in specific locations over the radio to perform short range communication testing of radio functions that would normally be performed in a conducted test system with a cabled connection. Thus, sensitive transmitter/receiver measurements like error vector magnitude (EVM), jitter, latency, etc. may be performed in a controlled low-loss, over-the-air manner, as well as all other protocol and radio conformance test requirements.

For devices that are designed to alter their radiation pattern based on environmental factors in order to attempt to maintain the best possible radio link condition, one may desire to know how well these devices adapt their pattern and where the energy is going that is not directed towards the targeted communication endpoint direction. While in some cases it may be possible to use internal software control of the radio chipset to create a specific radiation pattern, locking that in place while scanning it with a traditional 2-axis scanner, such approach provides an artificial picture of the overall performance of the device since it is not being allowed to alter its pattern based on environmental conditions.

In a traditional antenna pattern measurement system, such adaptation to the environmental conditions alters the quantity being measured, i.e., the direction and polarization of the radiation in each given direction around the DUT 1 at any given instant in time. If instead, an articulated positioner is used to hold a communication endpoint that can be moved relative to the DUT 1 and allow the DUT 1 to alter its radiation pattern as it sees fit to maintain that communication link, one can then use a second similarly articulated positioner to move a probe antenna around the device and probe the radiation pattern thus produced for each chosen relative orientation of the DUT 1 and communication endpoint.

Each positioner may be configured to be positioned manually, or by motors, hydraulics, pneumatics or other actuators receiving drive signals from a computer system. Thus, a user in front of a video monitor and using an input device such as a keyboard and/or mouse may select or input a trajectory of one or more positioners, each trajectory being defined by a set of positions at which a positioner is to be positioned sequentially. A mapping of the positions to motor controls may be performed by a position driver module within the computer system or at another node in the measurement system. The motor controls necessary to drive the positioner to the selected positions are output by the measurement system to motors driving the positioner.

The above approach is suited for probing the radiated power of the DUT 1 for each radiation pattern the DUT 1 is capable of creating. However, probing the receive pattern usually calls for a receiver sensitivity test, where the power from the communication endpoint is lowered to produce a target error rate at each orientation about the DUT 1. However, the ability of the DUT 1 to adapt its radiation pattern to maintain the best possible communication link would prevent the evaluation of a static beamformed pattern pointed in a particular direction. Moving the endpoint to a different position would potentially cause the DUT 1 to alter its radiation pattern in order to maintain the best possible link and thus the measured result would not be indicative of the instantaneous beamforming capability of the DUT 1, but rather an average of the best performance the DUT 1 could produce by beamforming to different directions at different times. In order to obtain the instantaneous beamforming pattern performance, a method of probing the receiver sensitivity without altering the direction of communication is needed.

For most adaptive antenna technologies like beamforming, the performance gain is not solely the array gain achieved by the antenna. For example, in a two-antenna system, transmit or receive diversity provides a potential power gain of 3 dB (2× the performance of a single antenna) while a beam formed version of the same two antennas 19 gives a 6 dB gain due to field/voltage summation instead of just power summation. Thus, beamforming is only producing a 3 dB gain over diversity techniques in this case. While larger arrays produce higher gains in the main lobe, one of the significant advantages of beamforming lies in the ability to place an extremely deep null in the pattern in the direction of a potential interferer.

The net improvement in signal-to-interference ratio (SIR) at the receiver is a function of the gain in the direction of the desired signal over the gain in the direction of the unwanted interferer. Thus, for example, in the two-antenna case, greater improvement in SIR is achieved by placing a 20 dB null towards the interferer than to point a 6 dB peak gain towards the signal.

To evaluate beamforming technologies, it is not enough to evaluate where the main lobe of a pattern is directed, but also how effective the adapted beam pattern is at blocking interference. By evaluating signal to interference ratio (SIR) rather than platform sensitivity of the receiver, a mechanism for evaluating the ability of the DUT 1 to beam form and what the pattern shape looks like in each configuration is provided. Instead of using a second positioner and probing antenna to measure fields, the second positioner and an antenna 19b mounted on the second positioner 20b can be used to introduce an interferer signal generated by the communication endpoint 30b, either in the form of random noise (e.g., AWGN) or in another interfering communication signal.

Embodiments described herein provide the flexibility to perform traditional conducted tests such as adjacent channel interference and other similar conformance tests, in addition to the OTA tests related to the radiation pattern. By altering the signal strength from a first antenna 19a relative to the strength of the interfering signal from the second antenna 19b, one can force the DUT 1 into the best possible configuration it can create for each position of source and interferer relative to the DUT 1 and each other. Numerous techniques can be envisioned for scanning the achieved patterns, depending on the design of the particular radio and its modes of operation. If detailed directional performance information is not required, the source and interferer locations can be scanned relative to the DUT 1 in such a way as to provide equivalent weighting of all relative positions around the surface of the sphere. In that case, the average throughput or a similar metric will indicate how well the DUT 1 was able to track the two interferers and adapt. By varying the speed of such a scan, additional information can be obtained on the rate of adaptation of the DUT 1.

In some embodiments, the interferer is moved to a set of all desired relative locations for each desired source location. At each configuration, a digital error rate or similar test is used to determine a threshold as either the interference is increased or the signal is decreased. In the case where feedback is available from the DUT 1 in the form of a receive signal strength indicator (RSSI) or Carrier to Noise (C/No) ratio, further tracking of the adaptation is possible to ensure that the DUT 1 is not altering its pattern or to determine when it does change. Thus, in some embodiments, receiver feedback from the DUT 1 may be used to determine a signal to interference ratio (SIR) or other signal, at the receiver, which may be a function of the gain of the array of the DUT 1 in both the signal direction and interference directions. In some embodiments, a software algorithm in the DUT 1 outputs data indicating what patterns are being employed by the DUT 1. For bi-directional (e.g., time division duplex (TDD)) communication where the DUT transmits and receives through the same beam formed antenna at the same frequencies, or otherwise in a symmetrical manner, then the transmit pattern may be probed as described above to monitor the beamforming as a function of the induced SIR.

The benefits of adding more interferers and/or probe locations to the system is obvious, although physical limitations (i.e., room to move the armatures and antennas 19) and the additional test times associated with the added degrees of freedom to the test system may limit the usefulness of these more complex systems. Eventually one would reach the complexity of the boundary array system where multiple active antennas 19 are arrayed around the DUT and any desired environment is produced.

Figure 9:
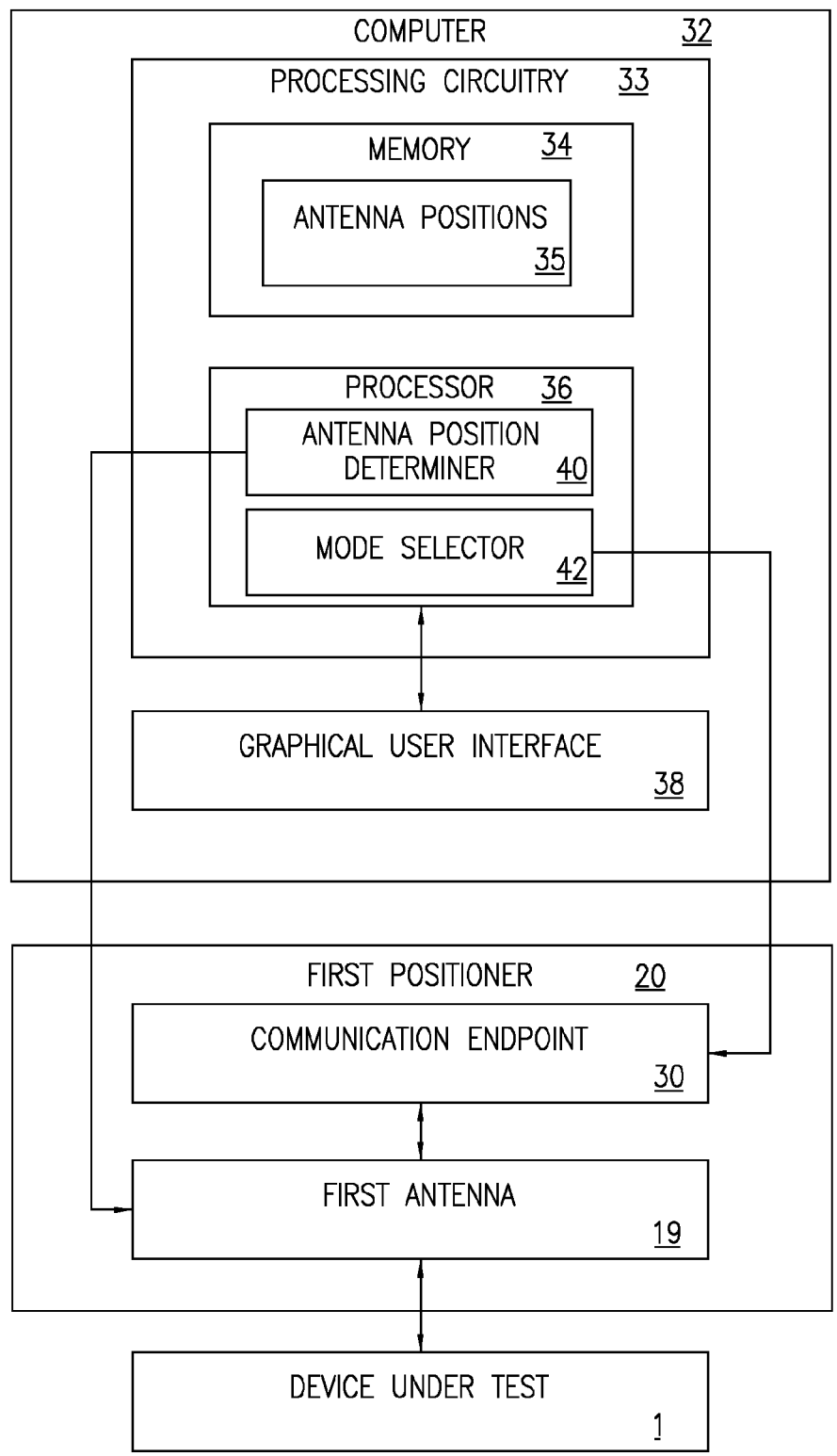
FIG. 9 is a block diagram of a computer configured for testing a DUT.

The various testing methods described herein can be performed under the control of a computer which controls the positions of the positioner(s) 20. FIG. 9 is a block diagram of a positioner 20 having mounted thereon a communication endpoint 30 and a first antenna 19. The communication endpoint 30 generates and processes communication signals according to a protocol such as an LTE protocol or WiFi protocol, for example. In some embodiments, the communication endpoint 30 is separate from the first positioner 20. The antenna 19 may radiate signals to the DUT 1 and receive signals from the DUT 1. In some embodiments, the positioner 20 moves under the control of a computer 32 having memory 34, a processor 36 and a graphical user interface (GUI) 38. The computer 32 may also control the communication endpoint 30 according to input by an operator via the GUI 38. The position of a platform (not shown in FIG. 9) upon which the DUT 1 is mounted may also be controlled by the computer 32. For example, an operator who conducts the test may specify a rotation rate of the platform via the GUI 38. The computer 32 may generate a signal to control the speed of a motor in response to the input by the operator.

Also, as noted above, the communication endpoint may be an entire transceiver mounted on the positioner or the positioner may have mounted thereon an amplifier and an up converter and/or down converter, with the base band components and intermediate frequency components (if any) of the receiver/transmitter located remote from and/or in close proximity to the positioner 20.

In addition to a traditional processor and memory, the computer 32 encompassing the processor 36 may comprise integrated circuitry for processing and/or control, e.g., one or more processors 36 and/or processor cores and/or FPGAs (Field Programmable Gate Array) and/or ASICs (Application Specific Integrated Circuitry).

Processing circuitry 33 may comprise and/or be connected to and/or be configured for accessing (e.g., writing to and/or reading from) memory 34, which may comprise any kind of volatile and/or non-volatile memory, e.g., cache and/or buffer memory and/or RAM (Random Access Memory) and/or ROM (Read-Only Memory) and/or optical memory and/or EPROM (Erasable Programmable Read-Only Memory). Such memory 34 may be configured to store code executable by control circuitry and/or other data, e.g., data pertaining to communication, e.g., configuration and/or address data of nodes, etc. Processing circuitry 33 may be configured to control any of the methods described herein and/or to cause such methods to be performed, e.g., by processor 36. Corresponding instructions may be stored in the memory 34, which may be readable and/or readably connected to the processing circuitry 33. In other words, processing circuitry may include a controller, which may comprise a microprocessor and/or microcontroller and/or FPGA (Field-Programmable Gate Array) device and/or ASIC (Application Specific Integrated Circuit) device. It may be considered that processing circuitry includes or may be connected or connectable to memory, which may be configured to be accessible for reading and/or writing by the controller and/or processing circuitry.

The processor 36 may operate according to computer instructions stored in the memory 34. The memory 34 stores antenna positions 40 at which each of at least one antenna 19 is positioned. The positions of the at least one antenna 19 are determined by an antenna position determiner 40. In some embodiments, a mode selector 42 selects one of a plurality of modes of operation of the equipment for testing a DUT 1. In one mode of operation, referred to herein as a probing mode, for each position of a communication antenna, a probing antenna is moved to different positions about the DUT 1 to measure a signal received from the DUT 1 at each different position of the probing antenna. In another mode of operation, referred to herein as an interfering mode, an interfering antenna is moved to one or more positions about the DUT 1 to transmit an interfering signal to the DUT 1 at each position of the interfering antenna.

The graphical user interface (GUI) 38 enables a user to control the positions of the first antenna and any additional antennas 19 used in a test of the DUT 1. For example, the GUI 38 may include a video monitor, a keyboard, a mouse and software executable by the processor 36 that enables the user to input configuration information which may include selected positions, selected pre-determined test patterns, viewing of test measurement results, and observing a graphical illustration of past, current and future positions of the antenna(s) 19 and DUT 1. In the alternative to a GUI, antenna positions and other configuration information and may be read from a file.

Based on the input from the user, the antenna positions determiner 40 will specify antenna positions to be used in a test of the DUT 11. Further, the processor 36 may receive information from the communication endpoint 30 concerning the signals being received from and/or transmitted to the DUT 1. Further, the GUI 28 enables the user to input information to be used by the communication endpoint 30 to formulate signals to be transmitted to the DUT 11 and to visualize data received from the DUT 11 either directly from a wireline connection to the DUT 11 or wirelessly from the DUT 11, or both.

Figure 10:
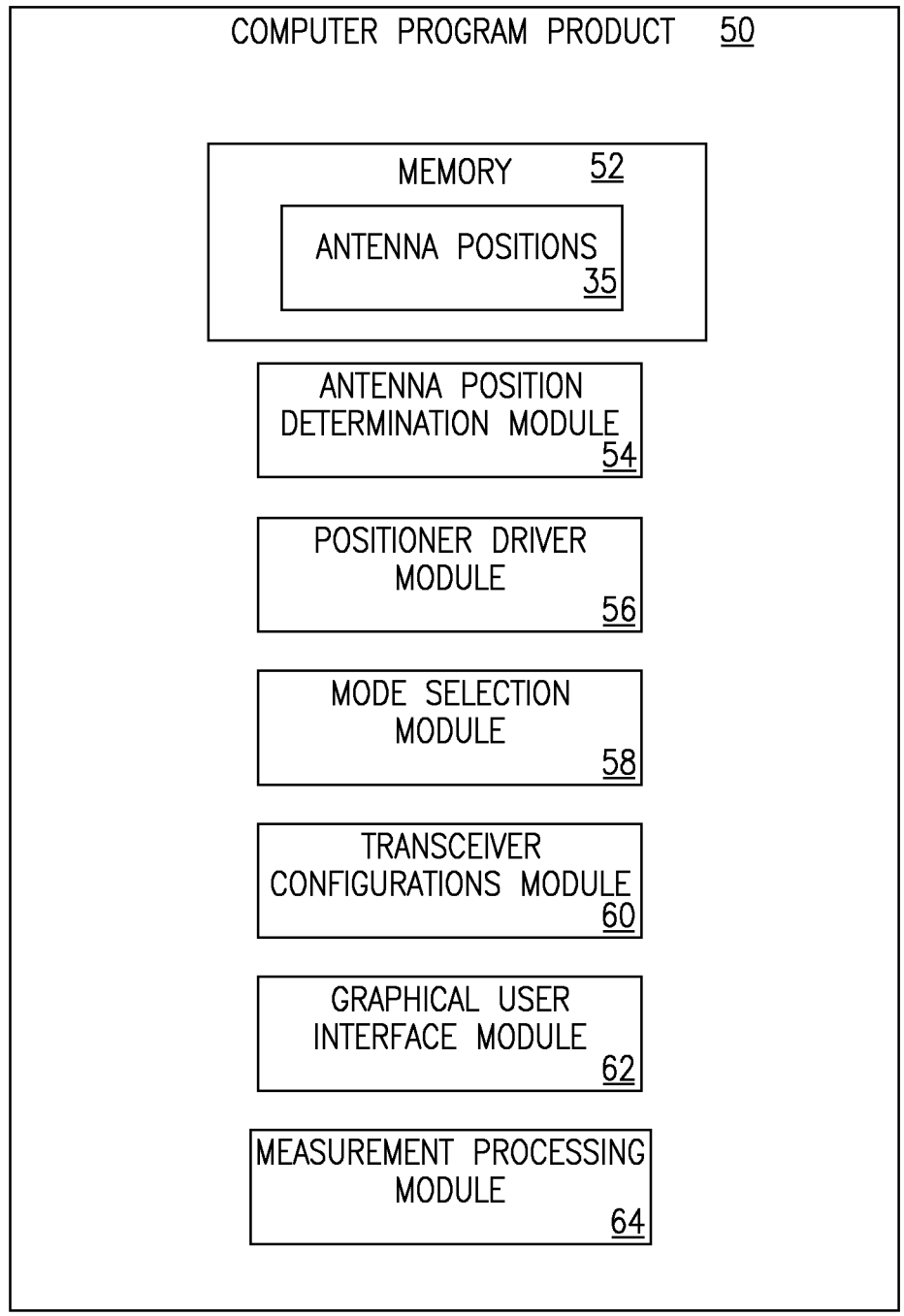
FIG. 10 is a block diagram of a computer program product for testing a DUT.

FIG. 10 is a block diagram of a computer program product 50 comprising a memory 52 and software modules 54, 56, 58, 60, 62 and 64. Each software module has executable software instructions that, when executed by a processor, cause the processor to perform the functions described above. The computer program product may be embodied in a magnetic medium, optical medium, a disk or a thumb drive, for example. Persons of ordinary skill in the art of computer programming would be able to write software instructions for achieving the functions of modules 54, 56, 58, 60, 62 and 64 based on their description herein.

In some embodiments, the same memory 52 or a different memory may be used to store antenna positions 35. The antenna positions determination module 54 contains software instructions to determine positions of the one or more antennas 19 used in a test. The positions may be determined based on user input and may also be a result of computing a trajectory of an antenna scan selected or programmed by an operator. The positioner driver module 56 contains software instructions to determine signals to be sent to one or more positioners to drive the positioners to a particular position. In other words, the positioner driver module 56 maps positions of the positioner determined from input by the of the operator to motor control signals to drive the positioner to each of the determined positions The mode selection module 58 contains software instructions to enable selection of an operating mode for a test to be performed on a DUT 1. For example, the user or operator may be able to select between a probing mode and an interfering mode. The transceiver configurations module 60 contains software instructions that enable configuration of a transceiver of a communication endpoint 30 to transmit and/or receive communication signals. For example, if the user or operator chooses a probing mode of operation, the transceiver configurations module 60 may instruct the transceiver of a first communication endpoint 30a to transmit a communication signal from a first antenna 19a on a first positioner 20a and instruct a second communication endpoint 30b to receive a signal from the DUT 1 at a plurality of positions of a second antenna 19b on a second positioner 20b. As another example, if the user or operator chooses an interfering mode of operation, the transceiver configurations module 60 may instruct the transceiver of a first communication endpoint 30a to transmit a communication signal from the first antenna 19a on a first positioner 20b and instruct a second communication endpoint 30b to transmit an interfering signal to the DUT 1 at a plurality of positions of a second antenna 19b on a second positioner 20b.

The GUI module 62 contains software instructions to provide a visual display of antenna and DUT positions and receive and process user instructions to conduct a test and establish parameters of the test. The measurement processing module 64 contains software for processing measurement data obtained during a test of a DUT 1. For example, in the probing mode, the signals received by the probing antenna on the second positioner may be processed by the measurement processing module 64 to produce received power data that may be plotted by the GUI module 62 as a radiation pattern. As another example, in the interfering mode, the response of the DUT 1 to a communication signal transmitted by a first antenna on a first positioner and at least one interfering signal transmitted by a second antenna on a second positioner may be processed by the measurement processing module 64 to produce a signal to interference ratio (SIR) as a function of position of the second antenna.

Note that in some embodiments, the functions performed by the computer 32 and computer program product 50 may be distributed among a plurality of nodes at different locations. For example, multiple computers and processing circuitry may be involved in a test. For example, the robotic arm positioner may have its own servo control mechanisms and software that converts a desired target or trajectory into a given set of positions and speeds for each motor. A layer of software may be employed to cause the robot arm to actually follow the desired points of a trajectory to position the antenna at points on a sphere so that another software program can cause recording of measurement data as a function of angular position around the DUT 1. Also, the software that controls position of the positioner may further include instructions that prevent the positioner from penetrating a test volume.

Further, a separate set of software instructions may be employed to enable choice of a type of communication protocol by which to test the DUT such as long term evolution (LTE) or Wi-Fi. Also, in some embodiments, additional software enables selection of AWGN or other type of interference. Thus, in some embodiments, an operator may set up all test parameters and settings at a central console or by setting parameters at different equipment interfaces located at different locations. In some embodiments, an extent of user interaction may be no more than to load a pre-defined set of test parameters and run the test.

Figure 11:
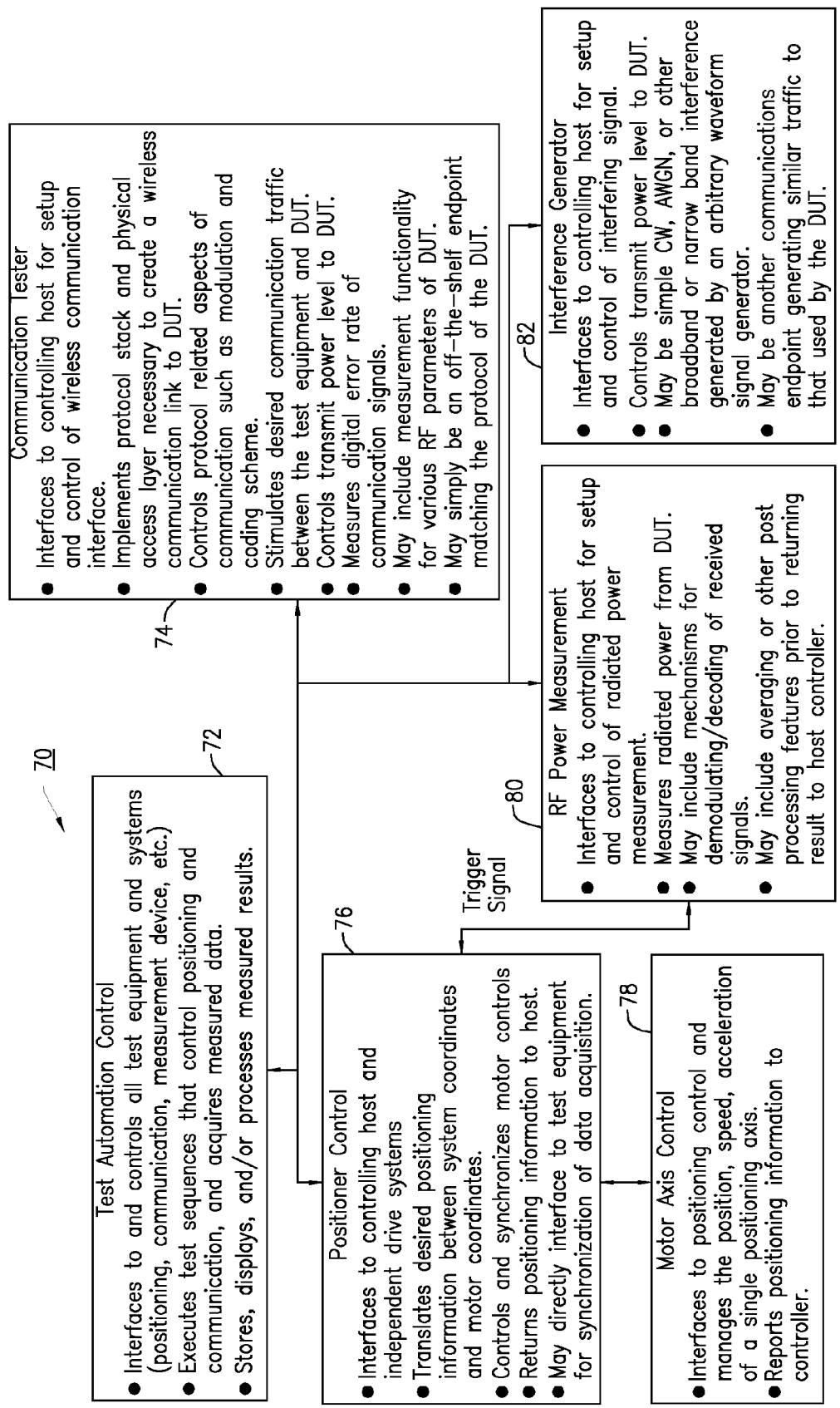
FIG. 11 is a block diagram of a distributed system for testing a DUT.

FIG. 11 is a block diagram of a system for testing a DUT 1 that may be distributed among a plurality of nodes. The interlinks as shown in FIG. 11 are intended to represent the control connections between the components and not necessarily the distributed traffic generation that could be considered part of the communication tester implementation. A test automation control unit 72, which may be implemented as processing circuitry, may be configured to perform the following functions:

Interfacing to and control of test equipment and systems (positioning, communication, measurement devices, etc.);

Executing test sequences that control positioning and communication, and acquires measured data;

Storing, displaying, and/or processing measured results.

A communication tester 74, which may be implemented as processing circuitry, may be configured to perform the following functions:

Interfacing to controlling host (such as the test automation control unit 72) for setup and control of a wireless communication interface (i.e., the emulated communication endpoint);

Implementing protocol stack and physical access layer necessary to create a wireless communication link to DUT 1;

Controlling protocol related aspects of communication such as modulation and coding scheme;

Stimulating desired communication traffic between the test equipment (i.e., the communication tester) and DUT 1;

Controlling transmit power level to DUT 1;

Measuring digital error rate of communication signals;

May include measurement functionality for various RF parameters of DUT 1; and May simply be an off-the-shelf endpoint matching the protocol of the DUT 1.

A positioner controller 76, which may be implemented as processing circuitry, may be configured to perform the following functions:

Interfacing to controlling host and independent drive systems (i.e., test automation control and motor axis control);

Translating desired positioning information between system coordinates and motor coordinates;

Controlling and synchronizing motor controls;

Returning positioning information to test automation control 72; and

May directly interface to test equipment for synchronization of data acquisition.

A motor axis controller 78, which may be implemented as processing circuitry, may be configured to perform the following functions:

Interfacing to positioner controller 76 and managing the position, speed, acceleration of a single positioning axis; and Reporting positioning information to the positioner controller 76.

Note that a motor axis controller may be provided for each of six degrees of freedom of the positioner 20.

An RF power measurement unit 80, which may be implemented as processing circuitry, may be configured to perform the following functions:

Interfacing to a controlling test automation control 72 for setup and control of radiated power measurement;

Measuring radiated power from DUT 1;

May include mechanisms for demodulating/decoding of received signals; and

May include averaging or other post processing features prior to returning result to host controller.

An interference generator 82, which may be implemented as processing circuitry, may be configured to perform the following functions:

Interfacing to the controlling test automation control 72 for setup and control of an interfering signal;

Controlling transmit power level to DUT 1;

Generating CW, AWGN, or other broadband or narrow band interference;

May be another communications endpoint generating similar traffic to that used by the DUT 1.

The distribution of functions shown in FIG. 11 is but one example of how various functions can be distributed to implement an embodiment capable of testing a DUT 1. The functions of a single block could be distributed across multiple components. For example, a single six axis controller may run the individual motor controls all on the same piece of hardware, rather than as separate modules. However, even at one location, there may be multiple processors or custom logic integrated circuits (ICs) that handle the details of the operations of controlling multiple motors. Likewise the traffic generation for communication may occur in the communication tester, or, as in the case of a wireless endpoint, may actually be streamed from the test automation controller 72 or a controlling computer to make the desired traffic and/or error rate/throughput measurements.

Figure 12:
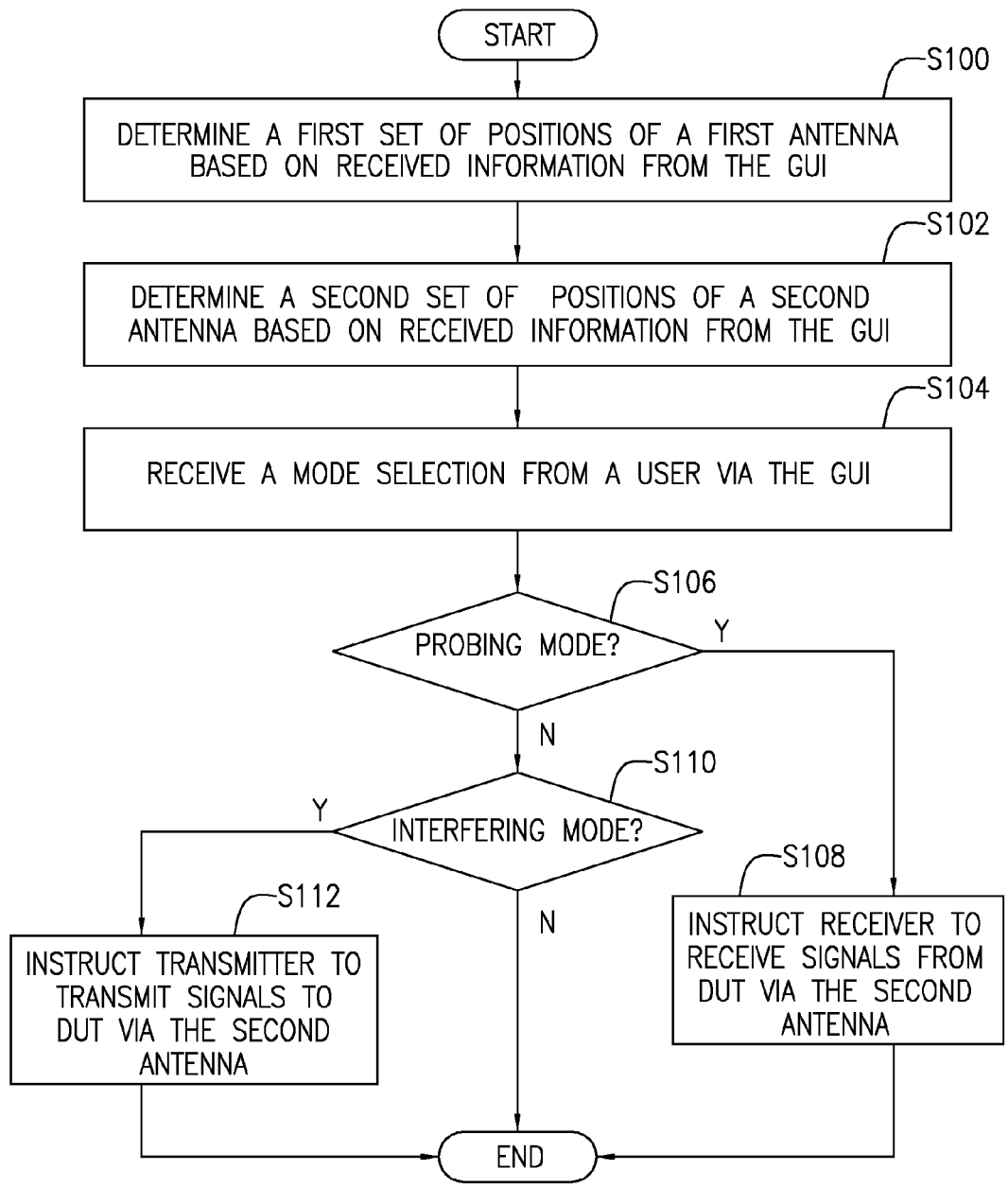
FIG. 12 is a flowchart of an exemplary process for testing a DUT.

FIG. 12 is a flowchart of an exemplary process for testing a DUT 1. The process includes determining a first set of positions of a first antenna 19a (block S100). The process also includes determining a second set of positions of a second antenna 19b (block S102). A mode selection from a user is received via a GUI (block S104). If the selected mode is a probing mode (block S106), a receiver is instructed to receive signals from the DUT 1 via the second antenna 19b (block S108). If the selected mode is an interfering mode (block S110), a transmitter is instructed to transmit interfering signals to the DUT 1n via the second antenna 19b (block S112). Note that the steps of FIG. 12 are not necessarily performed sequentially. Thus, for example, the steps of blocks S100 and S102 may be performed simultaneously.

Thus, in some embodiments, the DUT 1 is directed to transmit full power to the first antenna and the resultant pattern may be evaluated. In an interference scenario, in some embodiments, the interference is generated from a given direction of the second antenna while the ability of the DUT 1 to receive a signal from the first antenna is evaluated as a function of the associated signal and/or interference levels from each antenna.

Figure 13:
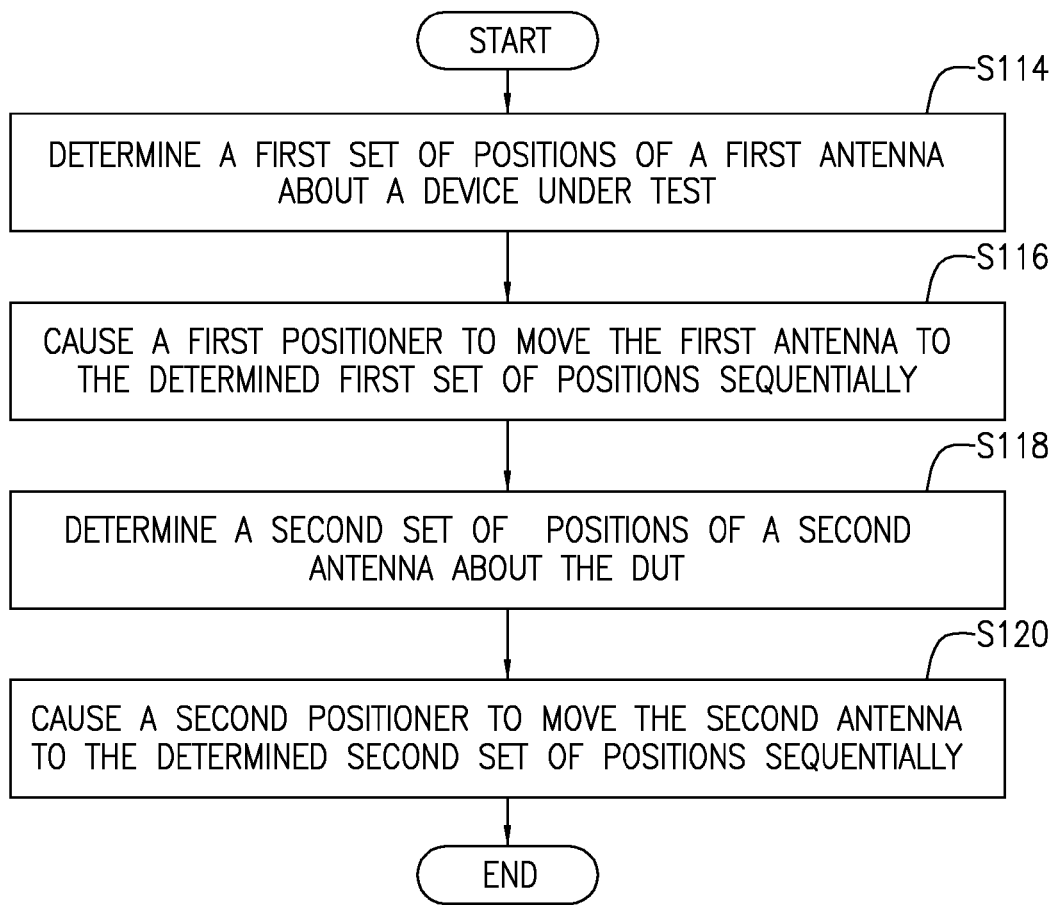
FIG. 13 is a flowchart of an alternative exemplary process for testing a DUT.

FIG. 13 is a flowchart of an exemplary process for testing a DUT 1. The process includes determining a first set of positions of a first antenna 19*a* about the DUT 1 (block S114). The process also includes causing a first positioner 20*a* to move the first antenna 19*a* to the determined first set of positions sequentially (block S116). The process further includes determining a second set of positions of a second antenna 19*b* about the DUT 1 (block S118). The process also includes causing a second positioner 20*b* to move the second antenna 19*b* to the determined second set of positions sequentially (block S120). Note that the steps of FIG. 13 are not necessarily performed sequentially. For example, the steps of blocks S116 and S120 may be performed simultaneously.

Thus, some embodiments include a computer program product 50 stored in a non-transitory medium, the computer program product 50 having instructions that when executed by the processor, cause the processor to determine a first set of at least one position of a first antenna 19*a*, and cause a first positioner 20*a* to move the first antenna 19*a* to the determined first set of at least one position sequentially. In some embodiments, the processor is programmed to control a transmitter of the communication endpoint 30 to cause the transmitter to transmit a signal to the DUT 1 for each position of the first set of positions.

A second positioner 20*b* may also be positioned under the control of the computer 32. The processor 36 may be programmed by the computer program product to determine a second set of positions of a second antenna 19*b*, and may further cause a second positioner 20*b* to move the second antenna 19*b* to the determined second set of positions sequentially. Further, the second positioner 20*b* may be caused to move to the second set of positions for each position of the first positioner 20*a*. Note that the second positioner 20*b* may be synchronized with the first positioner 20*a*, or may move independently of the position of the first positioner 20*a*. Note also that the positioners may be configured to follow different trajectories in a continuous or stepwise fashion.

Some embodiments include a positioner 20 configured to allow spatial probing about a device under test, DUT 1. The positioner includes a probe antenna at an end of the positioner and a plurality of joints configured to provide multiple degrees of positional freedom to enable variation of the position of the probe antenna with respect to the DUT 1.

In some embodiments, a positioner 20 configured to introduce active interference in a test volume where is located a device under test, DUT 1, is provided. The positioner includes an active interferer antenna 19 at an end of the positioner 20. A plurality of joints are configured to provide multiple degrees of positional freedom to enable variation of the position of the active interferer antenna 19 with respect to the DUT 1. In some embodiments, the positioner 20 further includes a converter between the active interferer antenna 19 and a communication endpoint to allow for low frequency communication with the test endpoint. In some embodiments, at least one joint is configured to accommodate a cable to conduct a signal to the active interferer antenna 19. In some embodiments, a joint has a through-bore to allow for routing of the cable.

In some embodiments, a test apparatus configured to test a device under test, DUT 1, is provided. The apparatus includes a first positioner 20*a* having a plurality of joints configured to provide multiple degrees of freedom to enable variation of position of an end of the first positioner 20*a*. A first antenna 19*a* is positioned at the end of the first positioner 20*a* and configured to at least one of transmit energy to the DUT 1 and receive energy from the DUT 1. In some embodiments, a second positioner 20*b* having a plurality of joints configured to provide multiple degrees of freedom to enable variation of position of an end of the second positioner 20*b* is provided. Also, a second antenna 19*b* is positioned at the end of the second positioner 20*b* and configured to one of receive a signal from the DUT 1 (in a probing mode) and transmit an interfering signal to the DUT 1 (in an interfering mode).

In some embodiments, a method of testing a device under test, DUT 1, situated within a test volume is provided. The method includes providing a first positioner 20*a* configured to enable spatial probing about the DUT 1 and having a probe antenna 19*a*, and providing a second positioner 20*b* configured to provide active interference in a test volume where is located the DUT 1 and having an active interferer antenna 19*b*. In some embodiments, the method further includes manipulating the second positioner 20*b* to position the active interferer antenna 19*b* to at least one position. The method may further include for each position of the active interferer antenna 19*b*, manipulating the first positioner 20*a* to position the probe antenna 19*a* to at least one position to probe a response of the DUT to the active interferer antenna 19*b*.

In some embodiments, a method of testing a device under test, DUT 1, situated within a test volume, is provided. The method includes providing a first positioner 20*a* configured to enable active excitation of antennas 19 of the DUT 1 and having an active communication antenna 19*b*, and providing a second positioner 20*a* configured to provide active interference in a test volume where is located the DUT 1 and having an active interferer antenna 19*b*. In some embodiments, the method further includes providing a third positioner configured to enable spatial probing about the DUT 1 and having a probe antenna.

In some embodiments, a system is configured to test a DUT 1 via one of a plurality of testing modes. The system includes a first positioner 20*a* having a first antenna 19*a* and a second positioner 20*b* having a second antenna 19*b*. The system also includes processing circuitry configured to cause the first antenna 19*a* to radiate a signal to the DUT 1. The processing circuitry is further configured to implement one of a plurality of testing modes. A testing mode may be a probing mode which causes, for each of at least one position of the first antenna 19*a*, the second antenna 19*b* to receive a signal from the DUT 1 at each of a second set of positions of the second antenna 19*b*. A testing mode may be an interfering mode which causes, for each of at least one position of the first antenna 19*a*, the second antenna 19*b* to transmit an interfering signal to the DUT 1 at each of the second set of positions of the second antenna 19*b*, so that communication performance of the DUT 1 may be monitored in the presence of interference. Another testing mode that may be implemented by the processing circuitry includes a third mode which causes, for each of at least one position of the first antenna 19*a*, the first antenna 19*a* to transmit a first communication signal to the DUT 1 and causes, for each of at least one position of the second antenna 19*b*, the second antenna 19*b* to transmit a second communication signal to the DUT 1 in order to test beamforming capabilities of the DUT 1.

In some embodiments, a computer program product stored in a non-transitory medium has instructions that when executed by a processor configures the processor to generate commands that determine a first set of at least one position of a first antenna 19a about a device under test, DUT 1; and generate commands that, for each position of the first positioner 20a, cause a second positioner 20b to sequentially move a second antenna 19b to a the determined second set of at least one positions. The processor may further be configured to generate a command to cause a transmitter to transmit via the first antenna 19a a communication signal to a device under test, DUT 1; and generate commands to cause a second positioner 20b to position a second antenna 19b at a plurality of positions about the DUT 1 to radiate one of an interference signal and a communication signal to the DUT 1 at each of the plurality of positions of the second antenna 19b.

As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer (to create a special purpose computer), special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the present embodiments are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A system configured to test a device under test (DUT) via one of a plurality of testing modes, the system comprising:
   a first robotic arm positioner exhibiting at least four degrees of freedom of motion and having a first antenna disposed at an end of the first robotic arm positioner, the end of the first robotic arm positioner position-able over a spherical surface about the DUT;
   a second robotic arm positioner exhibiting at least four degrees of freedom of motion and having a second antenna disposed at an end of the second robotic arm positioner, the end of the second robotic arm positioner position-able over a spherical surface about the DUT;
   circuitry configured to:
   implement one of a plurality of testing modes, the plurality of testing modes including:
   a probing mode in which, for each of at least one position of the first antenna, the first antenna is configured to radiate a communication signal, and the second antenna is configured to receive a signal from the DUT at each of a second set of positions of the second antenna, the second set of positions being selected in order to determine a beam forming capability of the DUT; and an interfering mode in which, for each of at least one position of the first antenna, the first antenna is configured to radiate a communication signal, and the second antenna is configured to transmit an interfering signal to the DUT at each of a second set of positions of the second antenna, the second set of positions being selected in order to determine a pattern of sensitivity of the DUT to interference.

2. The system of claim 1, wherein the circuitry further comprises at least one of receive circuitry and transmit circuitry mounted on the second robotic arm positioner in proximity to the second antenna and configured to at least one of receive a signal from the DUT in the probing mode and transmit an interfering signal to the DUT in the interfering mode.

3. The system of claim 1, wherein, in the interfering mode, the circuitry is further configured to process information received from the DUT to evaluate an ability of the DUT to receive the communication signal in a presence of the interference.

4. The system of claim 1, further comprising a third positioner having a third antenna, and wherein the circuitry is further configured to implement a second interfering mode which causes, for each of at least one position of the first antenna, the third antenna to transmit a second interfering signal to the DUT at each of a third set of positions of the third antenna.

5. The system of claim 1, wherein the plurality of testing modes further includes a third mode which causes, for each of at least one position of the first antenna, the first antenna to transmit a first communication signal to the DUT and causes, for each of at least one position of the second antenna, the second antenna to transmit a second communication signal to the DUT in order to test a performance of the DUT.

6. The system of claim 5, wherein, the tested DUT performance is at least one of adjacent channel interference receive signal strength, and carrier to noise ratio.

7. Equipment for testing a device under test, DUT, in one of a plurality of modes, the equipment comprising:
a first antenna position-able at an end of a first robotic arm positioner;
the first robotic arm positioner exhibiting at least four degrees of freedom of motion and configured to position the first antenna at a first plurality of positions about the DUT;
a first communication endpoint in electrical communication with the first antenna and configured to transmit signals to the DUT;
a second antenna position-able at an end of a second robotic arm positioner;
the second robotic arm positioner exhibiting at least four degrees of freedom of motion and configured to position the second antenna at a second plurality of positions about the DUT; and
a second communication endpoint in electrical communication with the second antenna and configured to operate in one of a plurality of testing modes, the testing modes including at least one of a probing mode and an interfering mode, the second antenna configured in the probing mode to receive a signal from the DUT in each of the second plurality of positions of the second antenna in order to determine a beam forming capability of the DUT and configured in the interfering mode to transmit an interference signal to the DUT in each of the second plurality positions of the second antenna in order to determine a pattern of sensitivity of the DUT to interference.

8. The equipment of claim 7, wherein the degrees of freedom of motion include a distance between the end of the first robotic arm positioner and the DUT.

9. The equipment of claim 7, wherein at least one joint of at least one of the first and second robotic arm positioners is configured to accommodate a cable to conduct a signal to the second antenna.

10. The equipment of claim 9, wherein a link forming a robotic arm positioner has a through-bore to allow routing of the cable.

11. The equipment of claim 7, wherein the second communication endpoint is mounted on the second positioner in proximity to the second antenna.

12. The equipment of claim 7, wherein a position of the first positioner is controlled by a computer.

13. The equipment of claim 7, wherein the plurality of testing modes includes a third mode wherein the first communication endpoint is configured to transmit first communication signals to the DUT, and the second communication endpoint is configured to transmit second communication signals to the DUT in order to test performance of the DUT.

14. The equipment of claim 7, further comprising:
a third antenna;
a third robotic arm positioner configured to position the third antenna about the DUT; and
a third communication endpoint configured to at least one of transmit to the DUT and receive from the DUT.

15. A non-transitory computer program storage medium having instructions that when executed by a processor, configure the processor to:
generate first commands that cause a first robotic arm positioner to move a first antenna located at an end of the first robotic arm positioner to a determined first set of positions about a device under test, DUT, the first commands capable of moving the first robotic arm positioner through at least four degrees of freedom of motion;
generate second commands that cause a second robotic arm positioner to move a second antenna located at an end of the second robotic arm positioner to a determined second set of positions about the DUT, the second commands capable of moving the second robotic arm positioner through at least four degrees of freedom of motion; and
generate a first transmit command to cause a first transmitter to transmit from the first antenna a communication signal to the DUT, via the first antenna, for each position of the first set of positions and to configure the processor to generate a second transmit command to cause a second transmitter to transmit from the second antenna an interference signal at each position of the second set of positions to determine a pattern of sensitivity of the DUT to interference.

16. The computer program storage medium of claim 15, further comprising instructions, that when executed by the processor, configure the processor to generate a transmit command to cause a transmitter to transmit from the first antenna a communication signal for each position of the first set of positions, and to configure the processor to generate a receive command to cause a receiver to receive from the second antenna a signal from the DUT for each position of the first set of positions and for each position of the second set of positions to determine a beam forming capability of the DUT.

17. The computer program storage medium of claim 15, wherein the processor is further configured to select a variable rate of scan of at least one of the first and second robotic arm positioners.

18. A method for testing a device under test, DUT, in one of a plurality of modes, the method comprising:
generating first commands that cause a first robotic arm positioner to move a first antenna to a determined first set of positions over a surface about a device under test, DUT, the first commands capable of moving the first robotic arm positioner over at least four degrees of freedom of motion;
generating second commands that cause a second robotic arm positioner to move a second antenna to a determined second set of positions over a surface about the DUT, the second commands capable of moving the second robotic arm positioner over at least four degrees of freedom of motion; and
generating a first transmit command to cause a first transmitter to transmit a communication signal to the DUT, via the first antenna, for each position of the first set of positions, and generating a second transmit command to cause a second transmitter to transmit an interference signal to the DUT via the second antenna for each position of the second set of positions to determine a pattern of sensitivity of the DUT to interference.

19. The method of claim 18, further comprising generating a transmit command to cause a transmitter to transmit a communication signal to the DUT, via the first antenna, for each position of the first set of positions and generating a receive command to cause a receiver to receive a signal from the DUT via the second antenna for each position of the second set of positions to determine a beam forming capability of the DUT.

20. The method of claim 18, further comprising adjusting a rate of motion of at least one of the first and second robotic arm positioner to determine a rate of adaptation of the DUT.

* * * * *